(12) United States Patent
You et al.

(10) Patent No.: US 9,570,528 B2
(45) Date of Patent: Feb. 14, 2017

(54) ORGANIC LIGHT-EMITTING DISPLAY APPARATUS

(71) Applicant: SAMSUNG DISPLAY CO., LTD., Yongin, Gyeonggi-Do (KR)

(72) Inventors: Chun-Gi You, Yongin (KR); Sun Park, Yongin (KR); Yul-Kyu Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/292,392

(22) Filed: May 30, 2014

(65) Prior Publication Data

US 2014/0353644 A1  Dec. 4, 2014

Related U.S. Application Data

(63) Continuation-in-part of application No. 14/099,897, filed on Dec. 6, 2013.

(30) Foreign Application Priority Data

May 30, 2013 (KR) .................. 10-2013-0062114
May 13, 2014 (KR) .................. 10-2014-0057451

(51) Int. Cl.
*H01L 29/04* (2006.01)
*H01L 27/32* (2006.01)
*H01L 51/52* (2006.01)

(52) U.S. Cl.
CPC ....... *H01L 27/3258* (2013.01); *H01L 27/3248* (2013.01); *H01L 51/5203* (2013.01); *H01L 51/5253* (2013.01); *H01L 2227/323* (2013.01)

(58) Field of Classification Search
CPC ... H01L 27/32–27/326; H01L 51/50–51/5012; H01L 51/525–51/5287; H01L 2227/32–2227/326; H01L 2251/5323–2251/5361; H01L 2924/12044
(Continued)

(56) References Cited

U.S. PATENT DOCUMENTS 6,690,110 B1 * 2/2004 Yamada ................. H05B 33/14
313/506
8,319,221 B2  11/2012 Choi et al.
(Continued)

FOREIGN PATENT DOCUMENTS

KR   10-2005-0112034   11/2005
KR   10-2010-0040679    4/2010
(Continued)

*Primary Examiner* — Earl Taylor
*Assistant Examiner* — Samuel Park
(74) *Attorney, Agent, or Firm* — Lewis Roca Rothgerber Christie LLP

(57) ABSTRACT

An organic light-emitting display apparatus includes: a thin film transistor including an active layer, a gate electrode, a source electrode, a drain electrode, a first insulating layer, and a second insulating layer; a pad electrode comprising a first pad layer and a second pad layer on the first pad layer; a third insulating layer covering the source electrode and the drain electrode and an end portion of the pad electrode; a pixel electrode comprising a semi-transmissive electrically conductive layer at an opening in the third insulating layer; a protection layer between the pixel electrode and the first insulating layer; a fourth insulating layer having an opening at a location corresponding to the opening formed in the third insulating layer and covering the end portion of the pad electrode; an emission layer on the pixel electrode; and an opposing electrode on the emission layer.

24 Claims, 18 Drawing Sheets

(58) Field of Classification Search
USPC .............................. 257/79–103, 40, 59, 72,
E51.001,257/E51.01; 438/99
See application file for complete search history.

(56) References Cited

U.S. PATENT DOCUMENTS

| | | | |
|---|---|---|---|
| 2008/0191213 A1* | 8/2008 | Bae | H01L 27/124 257/66 |
| 2010/0090209 A1 | 4/2010 | Ikari et al. | |
| 2011/0089406 A1 | 4/2011 | Ho et al. | |
| 2011/0108848 A1* | 5/2011 | Lee | H01L 27/3262 257/72 |
| 2011/0297944 A1* | 12/2011 | Choi | H01L 27/124 257/59 |
| 2012/0298984 A1* | 11/2012 | Park | H01L 27/1225 257/43 |
| 2013/0126882 A1 | 5/2013 | You et al. | |
| 2014/0014961 A1* | 1/2014 | Tsai | H01L 33/0041 257/59 |
| 2014/0159042 A1* | 6/2014 | Hutchings | H01L 21/02529 257/52 |

FOREIGN PATENT DOCUMENTS

| | | |
|---|---|---|
| KR | 10-2011-0133925 | 12/2011 |
| KR | 10-2013-0055446 | 5/2013 |

* cited by examiner

ORGANIC LIGHT-EMITTING DISPLAY
APPARATUS

CROSS-REFERENCE TO RELATED
APPLICATION

This application is a continuation-in-part of application Ser. No. 14/099,897 filed Dec. 6, 2013, which claims priority to and the benefit of Korean Patent Application No. 10-2013-0062114, filed on May 30, 2013, in the Korean Intellectual Property Office, the entire content of which is incorporated by reference. This application also claims priority to and the benefit of Korean Patent Application No. 10-2014-0057451, filed on May 13, 2014, in the Korean Intellectual Property Office. The entire contents of all of the above referenced applications are incorporated herein by reference.

BACKGROUND

1. Field

Embodiments of the present invention relate to an organic light-emitting display apparatus and a method of manufacturing the same.

2. Description of the Related Art

An organic light-emitting diode (OLED) display apparatus generally includes a hole injection electrode, an electron injection electrode, and an organic light-emitting layer formed therebetween. The OLED display apparatus is a self light-emitting display apparatus that emits light when holes injected from the hole injection electrode and electrons injected from the electron injection electrode recombine in the organic light-emitting layer to an excited state that gradually disappears thereafter.

Because of its high quality characteristics compared to other types of display devices, such as relatively low power consumption, relatively high brightness, and relatively fast response speed, the OLED display apparatus has received attention as a next generation display.

SUMMARY

Aspects of example embodiments of the present invention are directed toward an organic light-emitting display apparatus having an excellent display quality and a method of manufacturing the same.

According to an embodiment of the present invention, there is provided an organic light-emitting display apparatus including: a thin film transistor including an active layer, a gate electrode, a source electrode, a drain electrode, a first insulating layer between the active layer and the gate electrode, and a second insulating layer between the gate electrode and the source and drain electrodes; a pad electrode including a first pad layer at a same layer as the source electrode and the drain electrode and a second pad layer on the first pad layer; a third insulating layer covering the source electrode and the drain electrode and an end portion of the pad electrode; a pixel electrode including a semi-transmissive electrically conductive layer at an opening in the third insulating layer; a protection layer between the pixel electrode and the first insulating layer; a fourth insulating layer having an opening at a location corresponding to the opening formed in the third insulating layer, the fourth insulating layer covering the end portion of the pad electrode; an emission layer on the pixel electrode; and an opposing electrode on the emission layer.

The protection layer may include a same material as that of the seqond pad layer.

The second pad layer may include a transparent conductive oxide.

The transparent conductive oxide may include one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

A thickness of the protection layer may be in a range of about 200 Å to about 800 Å.

The source electrode and the drain electrode may each have a stack structure of a plurality of heterogeneous electrically conductive layers having different electron mobility.

The source electrode and the drain electrode may each include a layer including molybdenum and a layer including aluminum.

The source electrode and the drain electrode may each include a first metal layer and a second metal layer on the first metal layer.

The organic light-emitting display apparatus may further include a capacitor including a first electrode at a same layer as the active layer and a second electrode at a same layer as the gate electrode.

The first electrode of the capacitor may include a semiconductor material doped with ion impurities.

The second electrode of the capacitor may include a transparent conductive oxide.

The capacitor may further include a third electrode at a same layer as the source electrode and the drain electrode.

The organic light-emitting display apparatus may further include: a pixel electrode contact unit electrically coupled between the pixel electrode and one of the source electrode and the drain electrode through a contact hole formed in the third insulating layer. The pixel electrode contact unit may include: a first contact layer including a same material as that of the source electrode and the drain electrode; a second contact layer including a same material as that of the second pad layer; and a third contact layer at the first insulating layer and the second insulating layer and including a same material as that of the second electrode of the capacitor. The first contact layer may be electrically coupled to the third contact layer through a contact hole formed in the second insulating layer.

The pixel electrode contact unit may further include a fourth contact layer between the first insulating layer and the third insulating layer, and the fourth contact layer may include a same material as that of the gate electrode.

The organic light-emitting display apparatus may further include a capacitor including a first electrode at a same layer as the gate electrode and a second electrode at a same layer as the source electrode and the drain electrode.

The first electrode of the capacitor may include a same material as that of the gate electrode.

The second electrode of the capacitor may include a same material as that of the source electrode and the drain electrode.

The second insulating layer may be between the first electrode and the second electrode and the second electrode may be at a trench formed in the second insulating layer.

The first pad layer may include a same material as that of the source electrode and the drain electrode.

The semi-transmissive electrically conductive layer may include silver (Ag) or a silver alloy.

A first transparent conductive oxide layer may be between the pixel electrode and the protection layer.

A second transparent conductive oxide layer may be at an upper portion of the pixel electrode.

An opening in the second insulating layer, an opening in the third insulating layer, and an opening in the fourth insulating layer may overlap with each other, and a width of the opening in the third insulating layer is greater than a width of the opening in the fourth insulating layer and smaller than a width of the opening in the second insulating layer.

An end portion of the pixel electrode may be at a top end of the opening in the third insulating layer.

BRIEF DESCRIPTION OF THE DRAWINGS

The above and other features and aspects of embodiments of the present invention will become more apparent by describing in detail exemplary embodiments thereof with reference to the attached drawings in which.

DETAILED DESCRIPTION OF THE INVENTION

Figure 1:
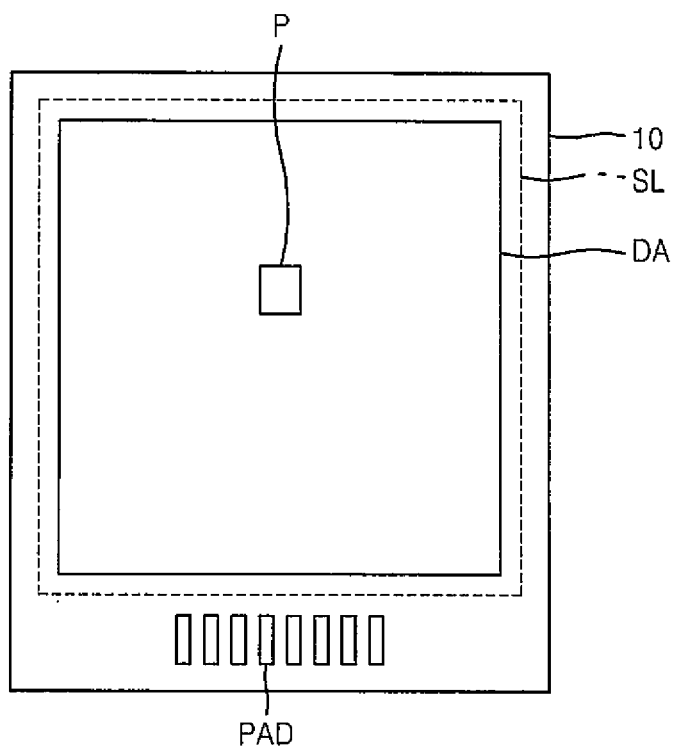
FIG. 1 is a schematic plan view illustrating an organic light-emitting display apparatus according to an embodiment of the present invention.

Embodiments of the present invention will now be described more fully with reference to the accompanying drawings for those of ordinary skill in the art to be able to perform the present invention without any difficulty. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art.

Also, parts in the drawings unrelated to the detailed description are omitted to ensure clarity of the present invention. Like reference numerals in the drawings denote like elements.

In various embodiments, elements having the same structure denoted by the same reference numeral are exemplarily explained in a first embodiment, and structures other than those in the first embodiment will be explained in other embodiments.

Also, sizes and thicknesses of elements in the drawings are arbitrarily shown for convenience of explanation, and thus are not limited to those as shown.

Various layers and regions are enlarged for clarity in the drawings. Thicknesses of some layers and regions are exaggerated for convenience of explanation in the drawings. It will also be understood that when a layer, film, region, or plate is referred to as being "on" another layer, film, region, or plate, it can be directly on the other layer, film, region, or plate, or intervening layers, films, regions, or plates may also be present therebetween.

Unless the context dictates otherwise, the word "comprise" or variations such as "comprises" or "comprising" is understood to mean "includes, but is not limited to" such that other elements that are not explicitly mentioned may also be included. Also, it will be understood that the term "on" encompasses orientations of both "over" and "under" without being limited to "over" in a direction of gravity. As used herein, the term "and/or" includes any and all combinations of one or more of the associated listed items. Expressions such as "at least one of," when preceding a list of elements, modify the entire list of elements and do not modify the individual elements of the list.

Figure 2:
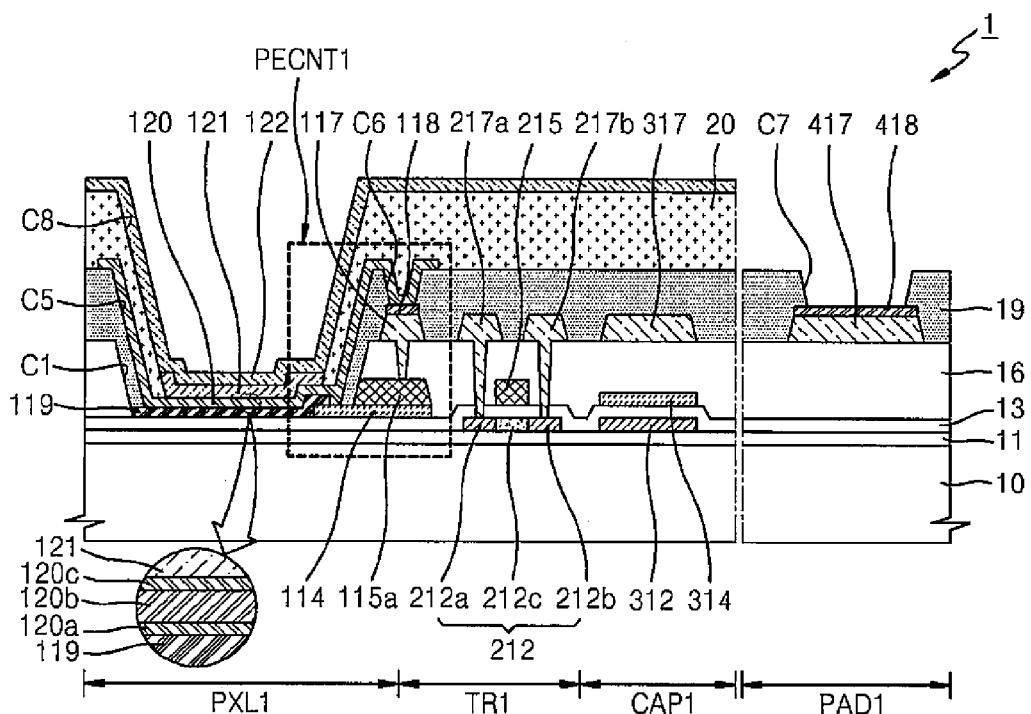
FIG. 2 is a schematic cross-sectional view illustrating a part of a pixel and a pad of an organic light-emitting display apparatus according to an embodiment of the present invention.

FIG. 1 is a schematic plan view illustrating an organic light-emitting display apparatus 1 according to an embodiment of the present invention. FIG. 2 is a schematic cross-sectional view illustrating a portion of a plurality of pixels P and a plurality of pads PAD of the organic light-emitting display apparatus 1 according to an embodiment of the present invention.

Referring to FIG. 1, a display area DA that includes the plurality of pixels P and displays an image is provided on a substrate 10 of the organic light-emitting display apparatus 1 according to an embodiment of the present invention. The display area DA is formed in a sealing line SL and includes a sealing member that seals the display area DA along the sealing line SL.

Referring to FIG. 2, a pixel area PXL1 including at least one organic emission layer 121, a transistor area TR1 including at least one thin film transistor, a capacitor area CAP1 including at least one capacitor, and a pad area PAD1 are provided on the substrate 10.

An active layer 212 of the thin film transistor is provided (e.g., formed, deposited, or positioned) on the substrate 10 and a buffer layer 11 is included (e.g., formed or deposited) in the transistor area TR1.

The substrate 10 may be a transparent substrate, such as a plastic substrate including polyethylene terephthalate (PET), polyethylene naphthalate (PEN), and polyimide as well as a glass substrate.

The buffer layer 11 forms a planar surface and prevents impurity elements from penetrating into the substrate 10, and may extend across the surface of the substrate 10. The buffer layer 11 may have a single layer structure or a multilayer structure including silicon nitride and/or silicon oxide.

The active layer 212 on the buffer layer 11 is included (e.g., formed, deposited, or located) in the transistor area TR1. The active layer 212 may be formed of a suitable semiconductor material such as amorphous silicon or crystalline silicon. The active layer 212 may include a channel area 212c, a source area 212a provided in the outside of the channel area 212c and doped with ion impurities, and a drain area 212b. The active layer 212 is not limited to amorphous silicon or crystalline silicon, and may include an oxide semiconductor or other suitable semiconductor materials.

A gate electrode 215 is provided on the active layer 212 in a location corresponding to (e.g., overlapping or vertically aligned with at least a portion of) the channel area 212c of the active layer 212 with a first insulating layer 13 that is an insulation film formed (e.g., positioned or deposited) between the gate electrode 215 and the active layer 212. The gate electrode 215 may have a single layer structure or a multilayer structure including one or more metal materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A source electrode 217a and a drain electrode 217b that are respectively coupled to the source region 212a and the drain region 212b of the active layer 212 are provided on the gate electrode 215 with a second insulating layer 16 that is an interlayer insulating film between the source and drain electrodes 217a and 217b and the gate electrode 215. Each of the source electrode 217a and the drain electrode 217b may have a structure of two or more heterogeneous metal layers having different electron mobility. For example, each of the source electrode 217a and the drain electrode 217b may have a two or more layer structure including a metal material selected from the group consisting of Al, Pt, Pd, Ag, Mg, Au, Ni, Nd, Ir, Cr, Li, Ca, Mo, Ti, W, Cu, and alloys of these metal materials.

A third insulating layer 19 is provided on the second insulating layer 16 to cover the source electrode 217a and the drain electrode 217b.

The first insulating layer 13 and the second insulating layer 16 may include single layer inorganic insulating films or multilayer inorganic insulating films. The inorganic insulating films forming the first insulating layer 13 and the second insulating layer 16 may include a suitable insulating material such as $SiO_2$, $SiN_x$, $SiON$, $Al_2O_3$, $TiO_2$, $Ta_2O_5$, $HfO_2$, $ZrO_2$, BST, or PZT, and the like.

The third insulating layer 19 may include an organic insulating film. The third insulating layer 19 may include general-purpose polymers (e.g., PMMA, PS), polymer derivatives having a phenol group, acrylic polymers, imide based polymers, arylether based polymers, amide based polymers, fluorinate polymers, p-xylene based polymers, vinyl alcohol based polymers, or suitable blends of these or similar materials.

A fourth insulating layer 20 is provided on the third insulating layer 19. The fourth insulating layer 20 may include an organic insulating film. The fourth insulating layer 20 may include general-purpose polymers (PMMA, PS), polymer derivatives having a phenol group, acrylic polymers, imide based polymers, arylether based polymers, amide based polymers, fluorinate polymers, p-xylene based polymers, vinyl alcohol based polymers, or suitable blends of these or similar materials.

A pixel electrode 120 provided on the buffer layer 11 and the first insulating layer 13 is included at (e.g., in) the pixel area PXL1.

The pixel electrode 120 is positioned at (e.g., in) an opening C5 formed in the third insulating layer 19.

The opening C5 formed in the third insulating layer 19 is greater than an opening C8 formed in the fourth insulating layer 20 and is smaller than an opening C1 formed in the second insulating layer 16. The opening C1 formed in the second insulating layer 16, the opening C5 formed in the third insulating layer 19, and the opening C8 formed in the fourth insulating layer 20 overlap with each other.

An end portion of the pixel electrode 120 is located at (e.g., on) a top end of the opening C5 formed in the third insulating layer 19 and covered by the fourth insulating layer 20. Meanwhile, a top surface of the pixel electrode 120 located at the opening C5 formed in the third insulating layer 19 is exposed to the opening C8 formed in the fourth insulating layer 20.

The pixel electrode 120 includes a semi-transmissive conductive (e.g., electrically conductive) layer 120b. The pixel electrode 120 may further include first and second transparent conductive oxide layers 120a and 120c that are respectively formed at (e.g., on) lower and upper portions of the semi-transmissive conductive layer 120b, and protect the semi-transmissive conductive layer 120b.

The semi-transmissive conductive layer 120b may include silver (Ag) or a silver alloy. The semi-transmissive conductive layer 120b forms a micro cavity structure, along with an opposing electrode 122 that is a reflective electrode that will be described later, thereby increasing or improving light efficiency of the organic light-emitting display apparatus 1.

The first and second transparent conductive oxide layers 120a and 120c may include at least one selected from the group consisting of indium tin oxide (ITO), indium zinc oxide (IZO), zinc oxide (ZnO), indium oxide (In2O3), indium gallium oxide (IGO), and aluminum zinc oxide (AZO). The first transparent conductive oxide layer 120a formed at the lower portion of the semi-transmissive conductive layer 120b and including the transparent conductive oxide may reinforce adhesion between a protection layer 119 and the pixel electrode 120. The second transparent conductive oxide layer 120c formed at the upper portion of the semi-transmissive conductive layer 120b and including the transparent conductive oxide may function as a barrier layer for protecting the semi-transmissive conductive layer 120b.

Meanwhile, if electrons are supplied to metal having a strong reduction like silver (Ag) forming the semi-transmissive conductive layer 120b during an etching process for patterning the pixel electrode 120, silver (Ag) ions present in an etchant in an ion state may be problematically educed as silver (Ag) again. Such educed silver (Ag) may be a particle related defect factor causing a dark spot during a subsequent process of forming the pixel electrode 120.

When the source electrode 217a or the drain electrode 217b, a first contact layer 117 of the pixel electrode contact unit PECNT1, the first pad layer 417 of a pad electrode, or a data wiring formed of the same material or substantially the same material as the metal materials of the source and drain electrodes 217a and 217b is exposed to the etchant during a process of etching the pixel electrode 120 including silver (Ag), silver (Ag) ions having a strong reduction may be educed as silver (Ag) again by receiving electrons from these metal materials. For example, when these metal materials include molybdenum or aluminum, silver (Ag) may be educed again by providing electrons received from molybdenum or aluminum to silver (Ag) ions again. Educed silver (Ag) particles may cause particle related defects in the display, such as dark spots.

However, the source electrode 217a or the drain electrode 217b of the organic light-emitting display apparatus 1 according to the present embodiment is covered by the third insulating layer 19 that is the organic film, and thus the source electrode 217a or the drain electrode 217b is not exposed to the etchant including silver (Ag) ions during the process of etching the pixel electrode 120 including silver (Ag), thereby preventing a particle related defect due to the eduction of silver (Ag).

The protection layer 119 is positioned between the pixel electrode 120 and the first insulating layer 13.

The protection layer 119 is formed of the same material or substantially the same material as those of a second pad layer 418 and a second contact layer 118 of the pixel electrode contact unit PECNT1. The protection layer 119 may be formed of a transparent conductive oxide including at least one selected from the group consisting of indium tin oxide (ITO), indium zinc oxide (IZO), zinc oxide (ZnO), indium oxide (In2O3), indium gallium oxide (IGO), and aluminum zinc oxide (AZO).

The semi-transmissive conductive layer 120b of the pixel electrode 120 including silver (Ag) may react with a material of the first insulating layer 13 located at a lower portion of the pixel electrode 120. Although the first transparent conductive oxide layer 120a is formed at (e.g., on) a lower portion of the semi-transmissive conductive layer 120b of the pixel electrode 120, the first transparent conductive oxide layer 120a has a very small thickness of about 70 Å, so the first transparent conductive oxide layer 120a does not entirely protect the semi-transmissive conductive layer 120b.

For example, when the first insulating layer 13 used (or utilized) as the gate insulating film has a multiple-layer (e.g., double or two-layer) structure in which a silicon oxide film and a silicon nitride film are sequentially stacked from the buffer layer 11 to the protection layer 119, the silicon nitride film provided on the first insulating layer 13 may be oxidized due to various factors, and thus, the silicon oxide film is formed on a surface of the silicon nitride film.

If the protection layer 119 is not formed between the pixel electrode 120 and the first insulating layer 13, silver (Ag) included in the semi-transmissive conductive layer 120b reacts with the silicon oxide film formed on the surface of the silicon nitride film and diffuses through a pin hole of the first transparent conductive oxide layer 120a formed to be thin at the lower portion of the semi-transmissive conductive layer 120b. Thus, a void may be generated in the semi-transmissive conductive layer 120b, and the diffused silver (Ag) may cause a dark spot defect.

However, according to the embodiment of the present invention, because the protection layer 119 is formed between the pixel electrode 120 and the first insulating layer 13, although a material that relatively easily reacts with silver (Ag) is formed on the first insulating layer 13, the protection layer 119 may block the reaction. Thus, a reactivity of silver (Ag) particles is controlled, thereby remarkably improving or reducing the occurrence of dark spot defects due to silver (Ag) particles.

Figure 4:
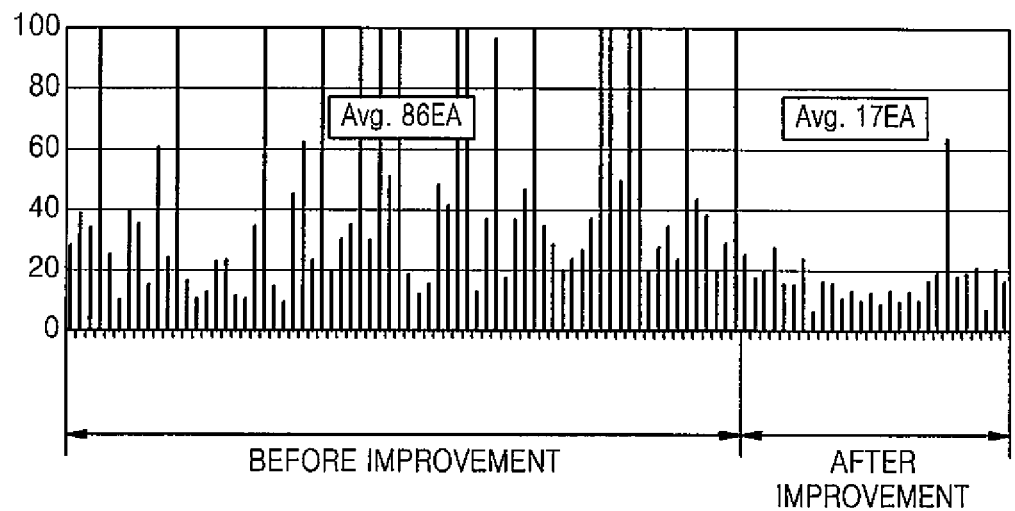
FIG. 4 is a graph illustrating a number of dark spot defects of an organic light-emitting display apparatus before and after a protection layer is applied under the same condition according to an embodiment of the present invention.

FIG. 4 is a graph illustrating a number of dark spot defects of an organic light-emitting display apparatus before and after the protection layer 119 is applied under the same condition according to an embodiment of the present invention.

Referring to FIG. 4, an average number of dark spot defects before the protection layer 119 is applied may be, for example, 86, whereas the average number of dark spot defects after the protection layer 119 is applied may be, for example, 17, which shows a considerable reduction in the number of dark spot defects.

Meanwhile, the protection layer 119 of the present embodiment may increase the light efficiency of the organic light-emitting display apparatus 1 as well as reduce the dark spot defect.

Figure 5:
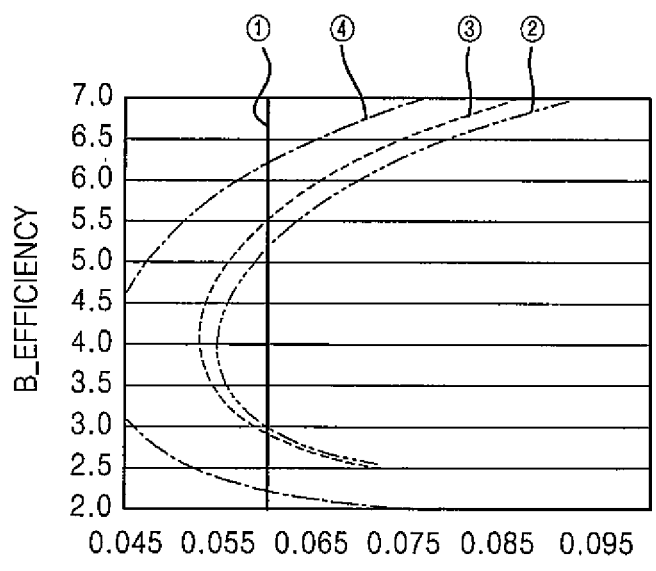
FIG. 5 is a graph illustrating a relationship between a y color coordinate and efficiency of a blue emission layer with respect to a thickness of a protection layer.

FIG. 5 is a graph illustrating a relationship between a y color coordinate and efficiency of a blue emission layer with respect to a thickness of a protection layer.

In more detail, FIG. 5 shows a relationship between the y color coordinate and efficiency of the blue emission layer when there is ①̂ a structure having no protection layer (reference), ②̂ a thickness of the protection layer 119 is 150 Å, ③̂ the thickness of the protection layer 119 is 300 Å, and ④̂ the thickness of the protection layer 119 is 370 Å. In this regard, a transparent conductive layer uses ITO (in cases of ①̂–④̂, ITO having a thickness of 70 Å is used (or utilized) as the first transparent conductive oxide layer 120a formed at the lower portion of the semi-transmissive conductive layer 120b).

As shown in the graph of FIG. 5, the greater the thickness of the protection layer 119, the broader the range of the color coordinate that may be selected with respect to the reference and the higher the efficiency. Meanwhile, although not shown in the graph, when the thickness of the protection layer 119 is equal to or greater than 800 Å, the range of the color coordinate is reduced, and the efficiency no longer increases. Thus, in terms of a function for blocking the reactivity of silver (Ag) of the protection layer 119 and an improvement in the light characteristics of the protection layer 119, in one embodiment the thickness of the protection layer 119 may be formed in the range of 200 Å to 800 Å.

The pixel electrode 120 is coupled to the pixel contact unit PECNT1 through a contact hole C6 formed in the third insulating layer 19. The pixel contact unit PECNT1 is electrically coupled to one of a source electrode and a drain electrode of a driving transistor and drives the pixel electrode 120.

The pixel contact unit PECNT1 may include the first contact layer 117 including the same material or substantially the same material as the above-described material of the source electrode 217a and the drain electrode 217b, the second contact layer 118 including a transparent conductive oxide, a third contact layer 114 including the transparent conductive oxide, and a fourth contact layer 115a including the same material or substantially the same material as that of the gate electrode 215.

That is, according to one embodiment, when the pixel electrode 120 and a driving device are electrically coupled to each other through the contact hole C6 formed in the third insulating layer 19, by way of the first contact layer 117 and the second contact layer 118, because a thickness of the pixel electrode 120 that is used as a semi-transmissive conductive layer may be relatively small or thin, a stable connection through an etching surface of the third insulating layer 19 or the contact hole C6 may be relatively difficult to obtain. However, according to the present embodiment, even if the connection through the contact hole C6 formed in the third insulating layer 19 fails, because the pixel electrode 120 directly contacts the third contact layer 114 on a floor (e.g., bottom) portion of the opening C5, a signal may be received from the driving device normally.

Meanwhile, although not shown in detail in FIG. 2, the first contact layer 117 is coupled to a data line that may be electrically coupled to one of the source electrode and the drain electrode of the driving transistor. When a transistor of FIG. 2 is the driving transistor, the first contact layer 117 may be directly coupled to the source electrode 217a or the drain electrode 217b.

An intermediate layer including the organic emission layer 121 is provided on the pixel electrode 120 with the top surface exposed at the opening C8, which is formed in (e.g., through) the fourth insulating layer 20. The organic emission layer 121 may be formed of a low molecular weight organic material or a high molecular weight organic material. When the organic emission layer 121 is formed of the low molecular weight organic material, a hole transport layer (HTL), a hole injection layer (HIL), an electron transport layer (ETL), and an electron injection layer (EIL) may be stacked with respect to the organic emission layer 121. Various other layers may be stacked if necessary. In this case, various low molecular weight organic materials may be used (or utilized) including copper phthalocyanine (CuPc), N'-diphenyl-benzidine (NPB), and tris-8-hydroxyquinoline aluminum (Alq3). When the organic emission layer 121 is formed of the high molecular weight organic material, the HTL may be used (or utilized) in addition to the organic emission layer 121. The HTL may be formed of poly-(3,4)-ethylene-dihydroxy thiophene (PEDOT) or polyaniline (PANI). In this case, a high molecular weight organic material may include a polyphenylene vinylene (PPV)-based high molecular weight organic material and a polyfluorene-based high molecular weight organic material. An inorganic material may be further provided between the pixel electrode 120, and the opposing electrode 122.

Although the organic emission layer 121 is positioned only at (e.g., on) a floor of the opening C8 in FIG. 2, this is for convenience of illustration only and the present invention is not limited thereto. In one embodiment, the organic emission layer 121 is formed on a top surface of the fourth insulating layer 20, along an etching surface of the opening C5 formed in the third insulating layer 19, as well as on the floor of the opening C8.

The opposing electrode 122 is provided on the organic emission layer 121 as a common electrode. The organic light-emitting display apparatus 1 according to the present embodiment uses (or utilizes) the pixel electrode 120 as an anode and the opposing electrode 122 as a cathode. Polarities of the electrodes may be switched.

The opposing electrode 122 may be configured as a reflective electrode including a reflective material. In this regard, the opposing electrode 122 may include one or more materials selected from the group consisting of Al, Mg, Li, Ca, LiF/Ca, and LiF/Al. The opposing electrode 122 is configured as the reflective electrode, so that light emitted from the organic emission layer 121 is reflected from the opposing electrode 122, is transmitted through the pixel electrode 120 (formed of, e.g., a semi-transmissive conductive or metal material), and is emitted toward the substrate 10.

An organic light-emitting display apparatus to which the present invention is applied is a bottom emission light-emitting display apparatus in which light is emitted from the organic emission layer 121 toward the substrate 10 to form an image. Thus, the opposing electrode 122 is configured as a reflective electrode.

A capacitor including a first electrode 312 positioned at (e.g., on) the same layer as (e.g., at least partially coplanar with) the active layer 212, a second electrode 314 positioned at (e.g., on) the same layer as (e.g., at least partially coplanar with) the gate electrode 215, and a third electrode 317 positioned at (e.g., on) the same layer as (e.g., at least partially coplanar with) the source electrode 217a and the drain electrode 217b is provided in the capacitor area CAP1 and on the substrate 10 and the buffer layer 11.

The first electrode 312 of the capacitor may be formed as a semiconductor doped with ion impurities, like the source area 212a and the drain area 212b of the active layer 212.

The second electrode 314 of the capacitor is positioned at (e.g., on) the first insulating layer 13 in the same way as the gate electrode 215, whereas materials of the second electrode 314 and the gate electrode 215 may be different from each other. The material of the second electrode 314 may include the transparent conductive oxide. The semiconductor doped with ion impurities is formed on the first electrode 312 through the second electrode 314, thereby forming the capacitor having a metal-insulator-metal (MIM) structure.

The third electrode 317 of the capacitor may be formed of the same material or substantially the same material as those of the source electrode 217a and the drain electrode 217b. As described above, the third electrode 317 is covered by the third insulating layer 19 that is the organic film, and thus the third electrode 317 is not exposed to the etchant including silver (Ag) ions during the process of etching the pixel electrode 120 including silver (Ag), thereby preventing the particle related defect due to the eduction of silver (Ag). The capacitor constitutes a parallel circuit including the first electrode 312, the second electrode 314, and a third circuit, thereby increasing a capacitance of the organic light-emitting display apparatus 1 without increasing an area of the capacitor. Thus, the area of the capacitor may be reduced by the increase in the capacitance, thereby increasing an aperture ratio.

The pad area PAD1 is an area at (e.g., in) which pad electrodes 417 and 418 are located or positioned outside the display area DA as connection terminals for an external driver.

The first pad layer 417 may have a structure of a plurality of metal layers having different electron mobility, like the above-described source electrode 217a and drain electrode 217b. For example, the first pad layer 417 may have a multilayer structure including one or more metal materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The second pad layer 418 may be formed of a transparent conductive oxide including at least one selected from the group consisting of indium tin oxide (ITO), indium zinc oxide (IZO), zinc oxide (ZnO), indium oxide (In$_2$O$_3$), indium gallium oxide (IGO), and aluminum zinc oxide (AZO). The first pad layer 417 may prevent pad electrodes from being exposed to moisture and oxygen, thereby preventing the deterioration of reliability of the pad electrodes.

As described above, although the first pad layer 417 is located at an area exposed to the contact hole C7 formed in the third insulating layer 19, because the second pad layer 418 that is a protection layer is formed on an upper portion of the first pad layer 417, the first pad layer 417 is not (or substantially not) exposed to the etchant during the process of etching the pixel electrode 120.

Moreover, an end portion (or peripheral area) of the first pad layer 417 that is sensitive to an external environment such as moisture or oxygen is covered by the third insulating layer 19, and thus, the end portion (or peripheral area) of the first pad layer 417 is also not exposed to the etchant during the process of etching the pixel electrode 120.

Therefore, the particle related defect due to the eduction of silver (Ag) may be prevented, and the deterioration of reliability of the pad electrodes may also be prevented.

Meanwhile, although not shown in FIG. 2, the organic light-emitting display apparatus 1 according to the present embodiment may further include a sealing member that seals the display area DA including the pixel area PXL1, the capacitor area CAP1, and the transistor area TR1. The sealing member may be formed as a sealing thin film formed by alternating a substrate including a glass member, a metal film, or an organic insulating film, and an inorganic insulating film.

A method of manufacturing the organic light-emitting display apparatus 1 according to the present embodiment will now be described with reference to FIGS. 3A through 3I below.

FIGS. 3A through 3I are schematic cross-sectional views illustrating a method of manufacturing the organic light-emitting display apparatus 1, according to an embodiment of the present invention.

Figure 3A:
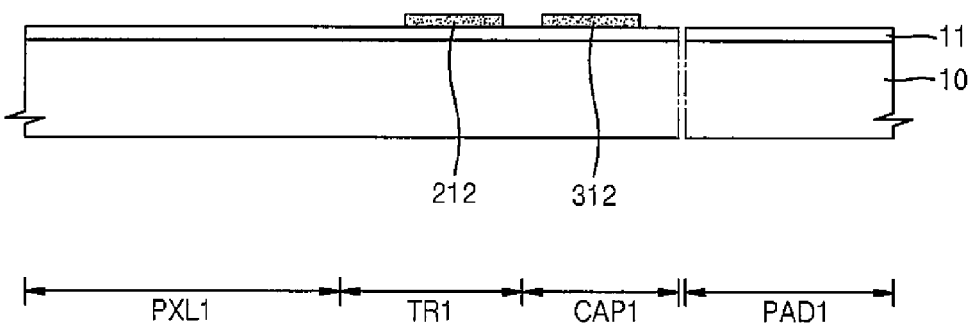
FIGS. 3A through 3I are schematic cross-sectional views illustrating a method of manufacturing the organic light-emitting display apparatus of FIG. 1, according to an embodiment of the present invention.

FIG. 3A is a schematic cross-sectional view illustrating a first mask process of the organic light-emitting display apparatus 1 according to the present embodiment of the present invention.

Referring to FIG. 3A, the buffer layer 11 is formed on the substrate 10 and a semiconductor layer is formed on the buffer layer 11. The semiconductor layer is patterned to form the active layer 212 of a thin film transistor and the first electrode 312 of a capacitor.

A photoresist is coated on the semiconductor layer, the semiconductor layer is patterned by using (or utilizing) photolithography using (or utilizing) a first photomask, and the active layer 212 and the first electrode 312 are formed. A first masking process using (or utilizing) photolithography includes performing exposure using (or utilizing) an exposure device on the first mask, and performing a series of processes, such as developing, etching, stripping, and ashing.

The semiconductor layer may include amorphous silicon or crystalline silicon. In this regard, crystalline silicon may be formed by crystallizing amorphous silicon. Amorphous silicon may be crystallized by using (or utilizing) various methods such as rapid thermal annealing (RTA), solid phase crystallization (SPC), excimer laser annealing (ELA), metal-induced crystallization (MIC), metal-induced lateral crystallization (MILC), sequential lateral solidification (SLS), and the like. The semiconductor layer is not limited to amorphous silicon or crystalline silicon and may include an oxide semiconductor or other suitable semiconductor material.

Figure 3B:
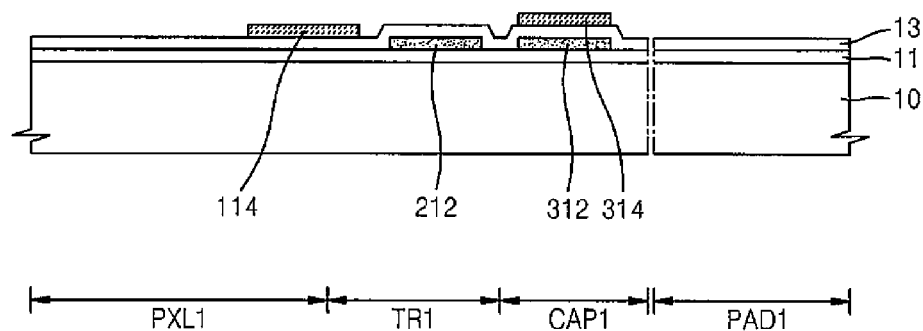

FIG. 3B is a schematic cross-sectional view illustrating a second mask process of the organic light-emitting display apparatus 1 according to the present embodiment of the present invention.

The first insulating layer 13 is formed on a resultant structure of the first mask process of FIG. 3A, and a transparent conductive oxide layer is formed on the first insulating layer 13 and then patterned.

As a result of the patterning, the third contact layer 114 of the pixel electrode contact unit PECNT1 and the second electrode 314 of the capacitor are formed on the first insulating layer 13.

Figure 3C:
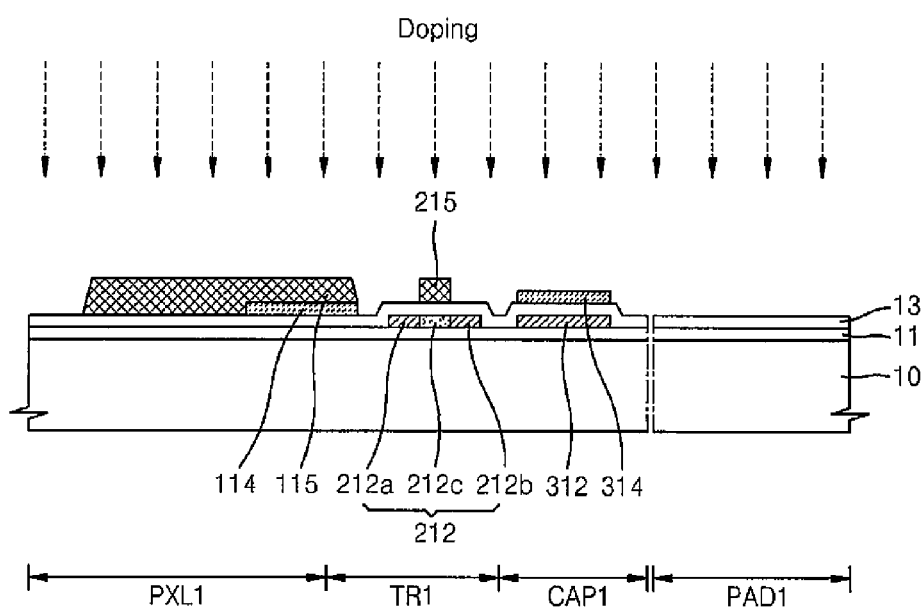

FIG. 3C is a schematic cross-sectional view for illustrating a third mask process of the organic light-emitting display apparatus 1 according to the present embodiment of the present invention.

A first metal (e.g., electrically conductive) layer is deposited on a resultant structure of the second mask process of FIG. 3B and then patterned. In this regard, as described above, the first metal layer may be a single layer or a multilayer formed of one or more metal materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

As a result of the patterning, the gate electrode 215 and a gate metal layer 115 covering the third contact layer 114 are formed on the first insulating layer 13.

The above-described structure is doped with ion impurities. The active layer 212 of the thin film transistor and the first electrode 312 of the capacitor are doped with ion impurities B or P.

The active layer 212 is doped with ion impurities by using (or utilizing) the gate electrode 215 as a self-aligning mask, and thus the active layer 212 includes the source area 212a and the drain area 212b doped with ion impurities and the channel area 212c positioned between the source area 212a and the drain area 212b. In this regard, the first electrode 312 of the capacitor is an electrode doped with ion impurities and forming a MIM CAP.

Therefore, the first electrode 312 of the capacitor as well as the active layer 212 are simultaneously or concurrently doped by using a single doping process, thereby reducing manufacturing cost by reducing the complexity of the doping process.

Figure 3D:
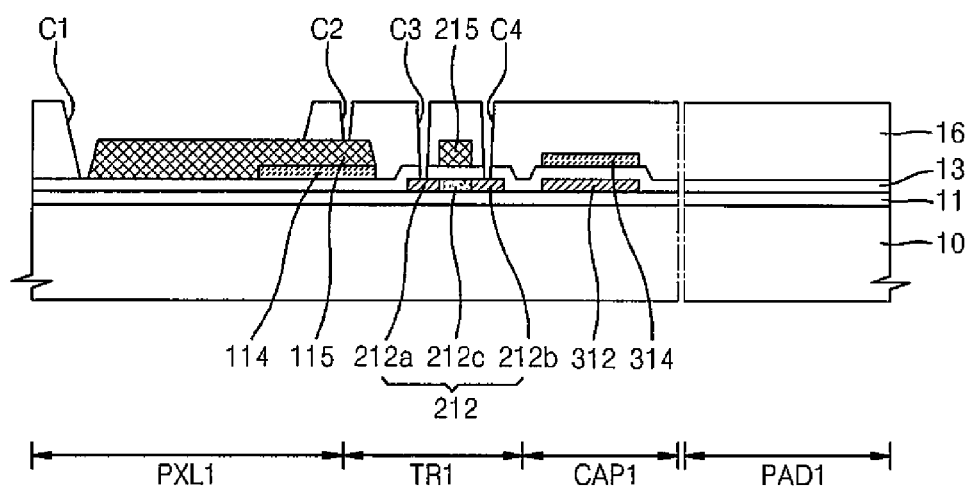

FIG. 3D is a schematic cross-sectional view illustrating a fourth mask process of the organic light-emitting display apparatus 1 according to the present embodiment of the present invention.

Referring to FIG. 3D, the second insulating layer 16 is formed on a resultant structure of the third mask process of FIG. 3C and then patterned, and thus openings C3 and C4 exposing the source area 212a and the drain area 212b of the active layer 212 and an opening C1 are formed in an area spaced apart from a side of the active layer 212 as an area at which the pixel electrode 120 is to be located that will be described later.

Figure 3E:
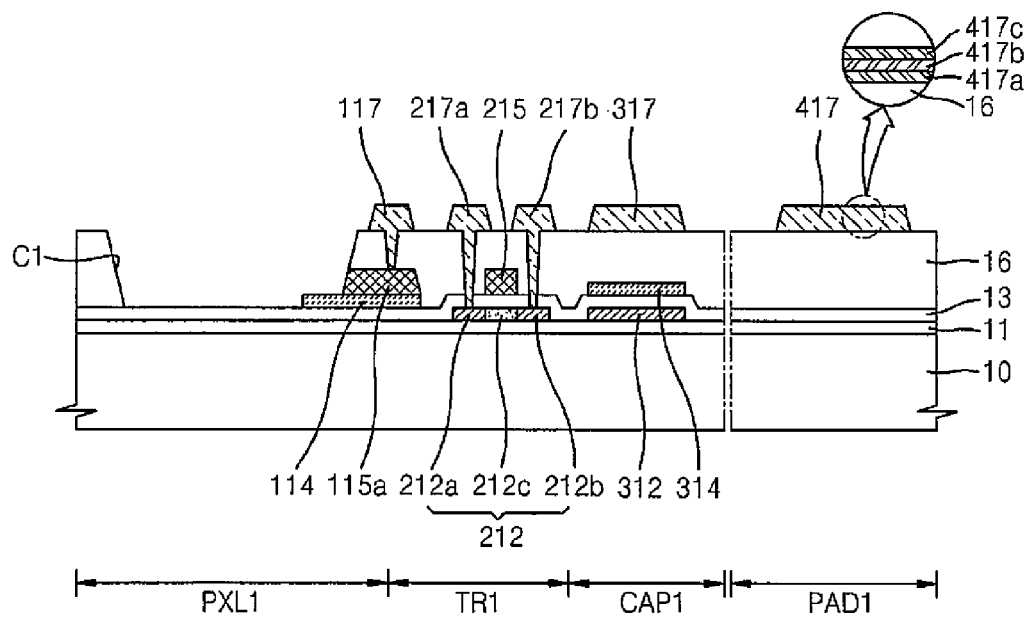

FIG. 3E is a schematic cross-sectional view illustrating a fifth mask process of the organic light-emitting display apparatus 1 according to the present embodiment of the present invention.

Referring to FIG. 3E, a second metal (e.g., electrically conductive) layer is formed on a resultant structure of the fourth mask process of FIG. 3D. The second metal is then patterned to form the source electrode 217a and the drain electrode 217b, the first contact layer 117 of the pixel electrode contact unit PECNT1, and the first pad layer 417 of a pad electrode.

The second metal layer may have a structure of two or more heterogeneous metal layers having different electron mobility. For example, the second metal layer may have a multiple (e.g., two or more) layer structure including a metal material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and alloys of these metal materials.

A configuration of the first pad layer 417 is illustrated in detail for an example illustration of a configuration of the second metal layer. For example, the second metal layer of the present embodiment may include a first layer 417a including molybdenum (Mo), a second layer 417b including aluminum (Al), and a third layer 417c including molybdenum (Mo).

The second layer 417b including aluminum (Al) is a metal layer having a small resistance and excellent electrical characteristic. The first layer 417a located at (e.g., on) a lower portion of the second layer 417b and including molybdenum (Mo) reinforces adhesion between the second insulating layer 16 and the second layer 417b. The third layer 417c located at (e.g., on) an upper portion of the second layer 417b and including molybdenum (Mo) may function as a barrier layer preventing a heel lock of aluminum included in the second layer 417b, oxidation, and diffusion.

Meanwhile, although not shown in FIG. 3E, a data wiring may also be formed by patterning the second metal layer during the fifth mask process.

Figure 3F:
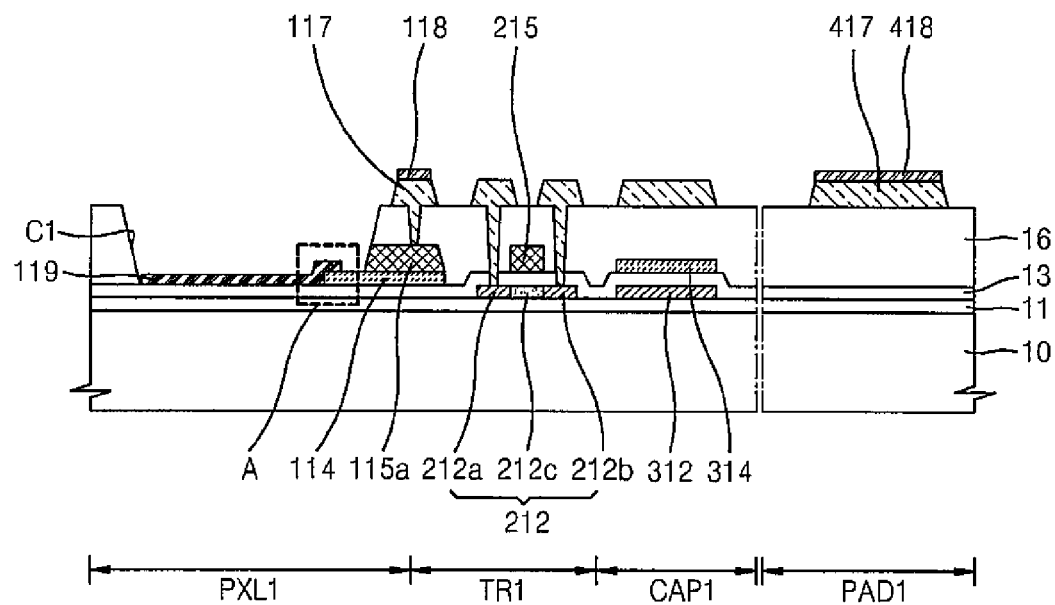

FIG. 3F is a schematic cross-sectional view illustrating a sixth mask process of the organic light-emitting display apparatus 1 according to the present embodiment of the present invention.

Referring to FIG. 3F, a transparent conductive oxide layer is formed on a resultant structure of the fifth mask process of FIG. 3E and then patterned to form the second contact layer 118 of the pixel electrode contact unit PECNT1, the second pad layer 418 of the pad electrode, and the protection layer 119.

The transparent conductive oxide layer includes at least one selected from the group consisting of indium tin oxide (ITO), indium zinc oxide (IZO), zinc oxide (ZnO), indium oxide (In2O3), indium gallium oxide (IGO), and aluminum zinc oxide (AZO).

Figure 3G:
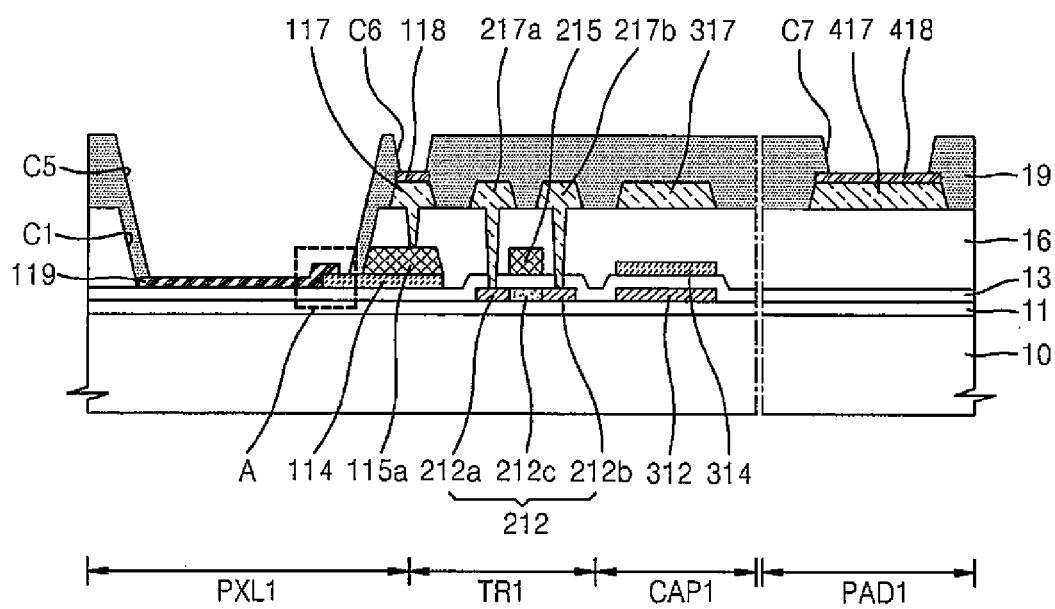

FIG. 3G is a schematic cross-sectional view illustrating a seventh mask process of the organic light-emitting display apparatus 1 according to the present embodiment of the present invention.

Referring to FIG. 3G, the third insulating layer 19 is formed on a resultant structure of the sixth mask process of FIG. 3F and then patterned, and thus the contact hole C6 exposing an upper portion of the second contact layer 118, the contact hole C7 exposing an upper portion of the second pad layer 418, and the opening C5 are formed in the pixel area PXL1 at (e.g., in) which the pixel electrode 120 is to be located that will be described later.

The third insulating layer 19 is formed to completely surround the source electrode 217a and the drain electrode 217b so as to prevent heterogeneous wirings having different electric potentials from contacting an etchant in which silver (Ag) ions are dissolved during a process of etching the pixel electrode 120 including silver (Ag) that will be described later.

The third insulating layer 19 may include an organic insulating film to function as a planarizing film. The organic insulating film may use (or utilize) general-purpose polymers (e.g., PMMA or PS), polymer derivatives having a phenol group, acrylic polymers, imide based polymers, arylether based polymers, amide based polymers, fluorinate polymers, p-xylene based polymers, vinyl alcohol based polymers, or suitable blends of these or other suitable insulating materials.

The opening C5 formed in the third insulating layer 19 and the opening C1 formed in the second insulating layer 16 overlap with each other while the opening C5 formed in the third insulating layer 19 is smaller than the opening C1 formed in the second insulating layer 16.

Figure 3H:
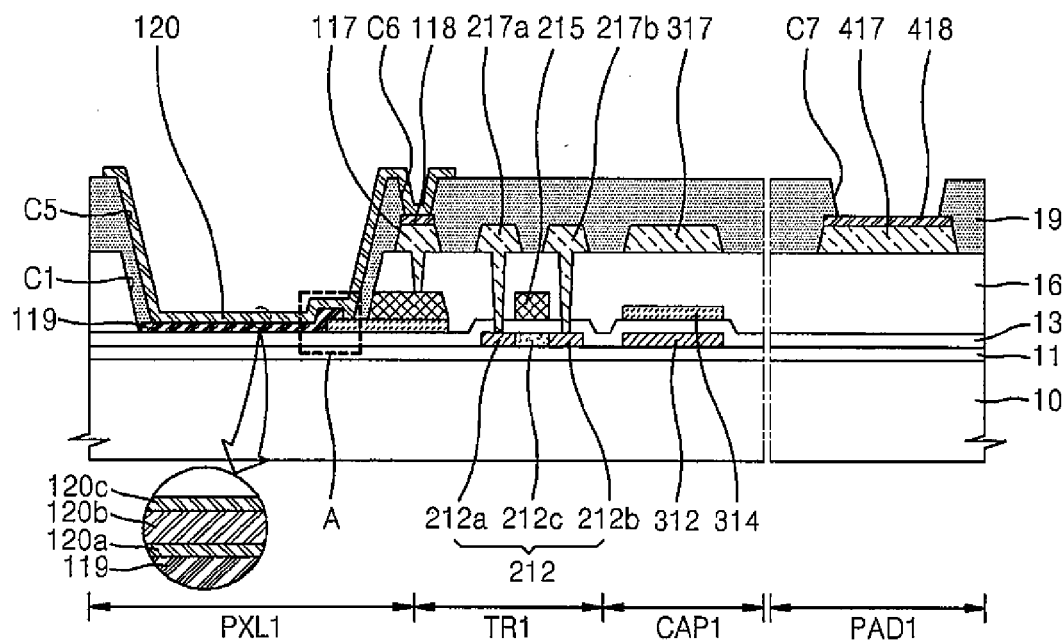

FIG. 3H is a schematic cross-sectional view illustrating an eighth mask process of the organic light-emitting display apparatus 1 according to the present embodiment of the present invention.

Referring to FIG. 3H, a semitransparent metal (e.g., electrically conductive) layer is formed on a resultant structure of the seventh mask process of FIG. 3G and then patterned to form the pixel electrode 120.

The pixel electrode 120 is coupled to a driving transistor through the pixel electrode contact unit PEDOT1 and located at (e.g., in) the opening C5 formed in the third insulating layer 19.

The pixel electrode 120 includes the semi-transmissive conductive layer 120b. The pixel electrode 120 may include the first and second transparent conductive oxide layers 120a and 120c that are respectively formed at lower and upper sides or surfaces of the semi-transmissive conductive layer 120b to protect the semi-transmissive conductive layer 120b.

The semi-transmissive conductive layer 120b may be formed of silver (Ag) or a silver alloy. The first and second transparent conductive oxide layers 120a and 120c may include at least one selected from the group consisting of indium tin oxide (ITO), indium zinc oxide (IZO), zinc oxide (ZnO), indium oxide (In2O3), indium gallium oxide (IGO), and aluminum zinc oxide (AZO). The semi-transmissive conductive layer 120b forms a micro cavity structure, along with the opposing electrode 122 that is a reflective electrode that will be described later, thereby increasing light efficiency of the organic light-emitting display apparatus 1.

Meanwhile, if electrons are supplied to electrically conductive materials (e.g., metal) having a strong reduction like silver (Ag) during an etching process for patterning the pixel electrode 120, silver (Ag) ions present in an etchant in an ion state may be problematically educed as silver (Ag) again. If the source electrode 217a or the drain electrode 217b, the first contact layer 117 of the pixel electrode contact unit PECNT1, the first pad layer 417 of a pad electrode, or a data wiring formed of the same material or substantially the same material as the metal materials of the source and drain electrodes 217a and 217b is exposed to the etchant during a process of etching the pixel electrode 120 including silver (Ag), silver (Ag) ions having a strong reduction may be educed as silver (Ag) again by receiving electrons from these metal materials.

However, the source electrode 217a or the drain electrode 217b according to the present embodiment is patterned before the eight mask process of patterning the pixel electrode 120 and is covered by the third insulating layer 19 that is the organic film. Accordingly, the source electrode 217a or the drain electrode 217b is not exposed to the etchant including silver (Ag) ions during the process of etching the pixel electrode 120 including silver (Ag), thereby preventing or reducing a particle related defect due to the eduction of silver (Ag).

Although the first contact layer 117 of the pixel electrode contact unit PECNT1 and the first pad layer 417 according to the present embodiment are respectively positioned at (e.g., in) areas exposed by the contact holes C6 and C7 formed in the third insulating layer 19, because the second contact layer 118 of the pixel electrode contact unit PECNT1 and the second pad layer 418 that are protection layers are respectively formed on the first contact layer 117 of the pixel electrode contact unit PECNT1 and the first pad layer 417, the first contact layer 117 of the pixel electrode contact unit PECNT1 and the first pad layer 417 are not exposed to the etchant during the process of etching the pixel electrode 120, thereby preventing or reducing a particle related defect due to the eduction of silver (Ag).

If the protection layer 119 is not formed between the pixel electrode 120 and the first insulating layer 13, silver (Ag) included in the semi-transmissive conductive layer 120b reacts with a silicon oxide film formed on a surface of a silicon nitride film and diffuses through a pin hole of the first transparent conductive oxide layer 120a formed to be thin in the lower portion of the semi-transmissive conductive layer 120b. Thus, a void is generated in the semi-transmissive conductive layer 120b, and the diffused silver (Ag) may cause a dark spot defect.

However, according to the embodiment of the present invention, because the protection layer 119 is formed between the pixel electrode 120 and the first insulating layer 13, although a material that easily reacts with silver (Ag) is formed on the first insulating layer 13, the protection layer 119 may block the reaction. Thus, a reactivity of silver (Ag) particles is controlled, thereby remarkably improving the dark spot defect due to silver (Ag) particles.

Figure 3I:
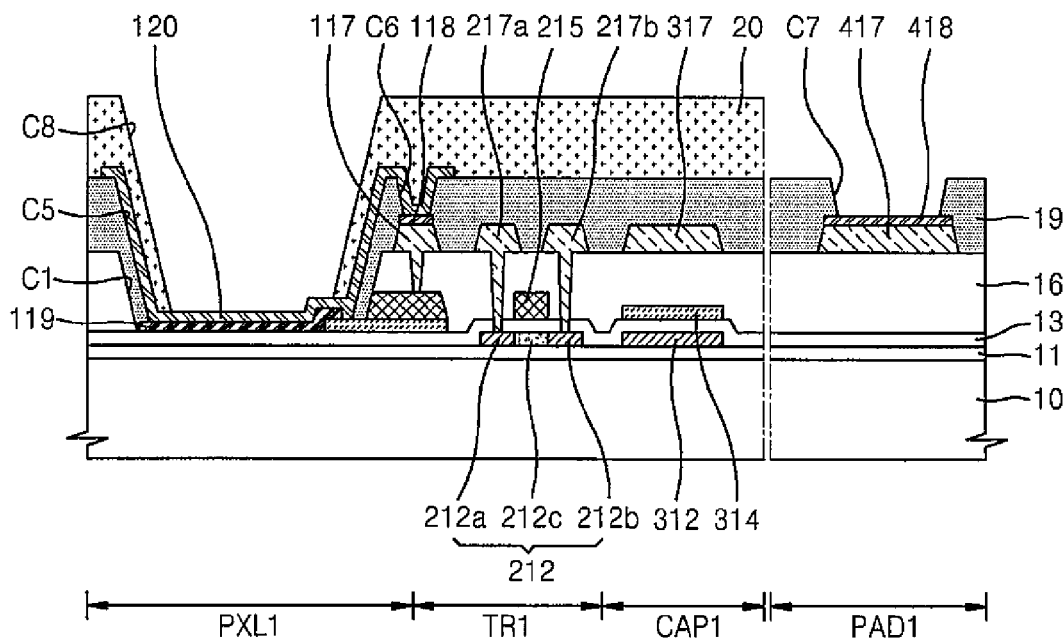

FIG. 3I is a schematic cross-sectional view illustrating a ninth mask process of the organic light-emitting display apparatus 1 according to the present embodiment of the present invention.

Referring to FIG. 3I, the fourth insulating layer 20 is formed on a resultant structure of the eighth mask process of FIG. 3H, and then the ninth mask process of forming the opening C8 exposing an upper portion of the pixel electrode 120 is performed.

The fourth insulating layer 20 functions as a pixel defining layer and may include an organic insulating film including general-purpose polymers (e.g., PMMA, PS), polymer derivatives having a phenol group, acrylic polymers, imide based polymers, arylether based polymers, amide based polymers, fluorinate polymers, p-xylene based polymers, vinyl alcohol based polymers, or suitable blends of these or other suitable insulating materials.

An intermediate layer including the organic emission layer 121 of FIG. 2 is formed on a resultant structure of the eighth mask process of FIG. 3H, and the opposing electrode 122 of FIG. 2 is formed.

According to the above-described organic light-emitting display apparatus 1 and method of manufacturing the organic light-emitting display apparatus 1, the pixel electrode 120 includes the semi-transmissive conductive layer 120b, thereby increasing light efficiency of the organic light-emitting display apparatus 1 by a micro-cavity.

The source electrode 217a or the drain electrode 217b is covered by the third insulating layer 19 that is the organic film, and thus the source electrode 217a or the drain electrode 217b is not exposed to the etchant including silver (Ag) ions, thereby preventing the particle related defect due to the eduction of silver (Ag).

The second contact layer 118 of the pixel electrode contact unit PECNT1 and the second pad layer 418 that are protection layers are respectively formed on the first contact layer 117 of the pixel electrode contact unit PECNT1 and the first pad layer 417, and thus the first contact layer 117 of the pixel electrode contact unit PECNT1 and the first pad layer 417 are not exposed to the etchant during the process of etching the pixel electrode (120), thereby preventing the particle related defect due to the eduction of silver (Ag).

Further, because the protection layer 119 is formed at (e.g., on) a lower portion of the pixel electrode 120, although a material that easily reacts with silver (Ag) is formed on the first insulating layer 13, the protection layer 119 may block the reaction. Thus, a reactivity of silver (Ag) particles is controlled, thereby remarkably improving the dark spot defect due to silver (Ag) particles.

An organic light-emitting display apparatus 2 according to a comparison example will now be described with reference to FIG. 6 below.

The same reference numerals denote the same elements below. Differences between the organic light-emitting display apparatus 1 according to the previous embodiment and the organic light-emitting display apparatus 2 according to the comparison example will now be described.

Figure 6:
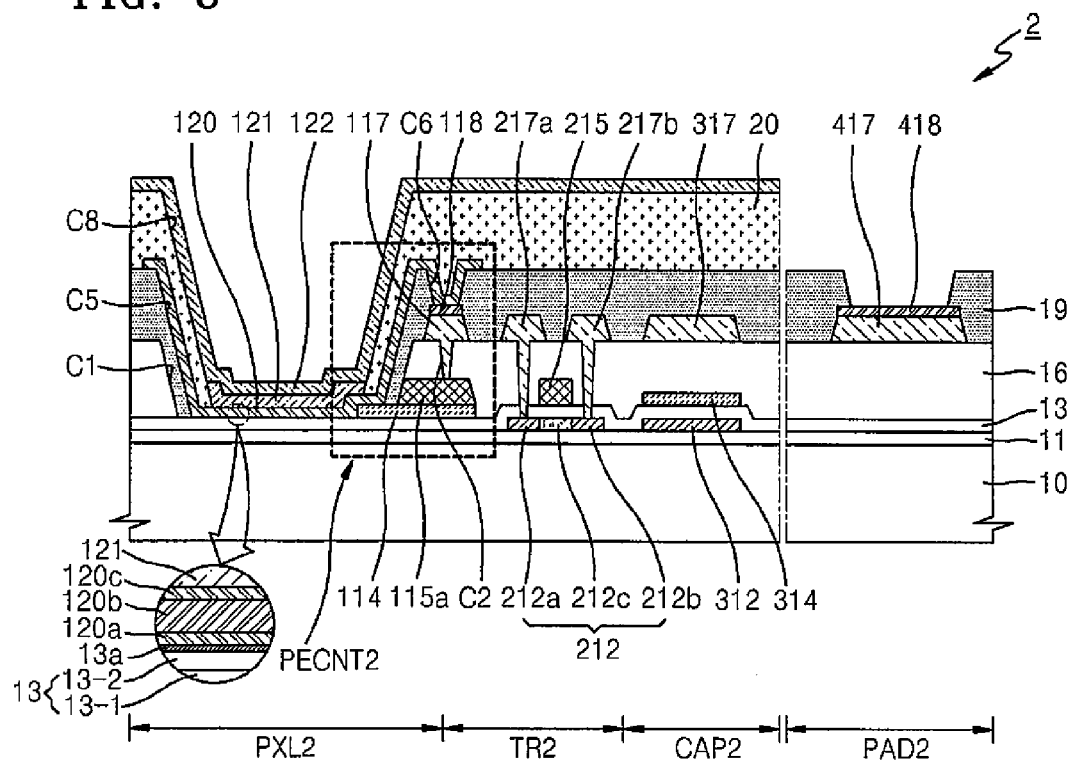
FIG. 6 is a schematic plan view illustrating an organic light-emitting display apparatus according to a comparison example.

Referring to FIG. 6, a pixel area PXL2 including the at least one organic emission layer 121, a transistor area TR2 including at least one thin film transistor, a capacitor area CAP2 including at least one capacitor, and a pad area PAD2 are provided on the substrate 10.

The transistor area TR2, the capacitor area CAP2, and the pad area PAD2 of the organic light-emitting display apparatus 2 according to the comparison example have similar configurations as those of the organic light-emitting display apparatus 1 according to the previous embodiment, except for the pixel area PXL2.

The pixel area PXL2 according to the comparison example does not include the protection layer 119 shown in FIG. 2 between the pixel electrode 120 and the first insulating layer 13.

The pixel electrode 120 includes the semi-transmissive conductive layer 120b and the first and second transparent conductive oxide layers 120a and 120c that are respectively formed at (e.g., on) lower and upper portions of the semi-transmissive conductive layer 120b to protect the semi-transmissive conductive layer 120b.

The first transparent conductive oxide layer 120a formed at the lower portion of the semi-transmissive conductive layer 120b has a very small thickness of about 70 Å, and thus the first transparent conductive oxide layer 120a may not entirely protect the semi-transmissive conductive layer 120b.

For example, when the first insulating layer 13 used (or utilized) as the gate insulating film has a double structure in which a silicon oxide film 13-1 and a silicon nitride film 13-2 are sequentially stacked from the buffer layer 11 to the pixel electrode 120, the silicon nitride film 13-2 provided on the first insulating layer 13 may be oxidized due to various factors, and thus a silicon oxide film 13a may be formed on a surface of the silicon nitride film 13-2.

The protection layer 119 is not formed between the pixel electrode 120 and the first insulating layer 13, and thus silver (Ag) included in the semi-transmissive conductive layer 120b may react with the silicon oxide film formed on the surface of the silicon nitride film and diffuse through a pin hole of the first transparent conductive oxide layer 120a formed to be thin at (e.g., on) the lower portion of the semi-transmissive conductive layer 120b. Thus, a void may be generated in the semi-transmissive conductive layer 120b, and the diffused silver (Ag) may cause a dark spot defect.

For example, when the first insulating layer 13 used (or utilized) as a gate insulating film has a multiple layer structure in which the silicon oxide film 13-1 and the silicon nitride film 13-2 are sequentially stacked from the buffer layer 11 to the pixel electrode 120, the silicon nitride film 13-2 provided on the first insulating layer 13 may be oxidized. In this regard, the silicon oxide film 13a may be formed on a surface of the silicon nitride film 13-2.

The silicon oxide film 13a causes a pin hole in the first transparent conductive oxide layer 120a formed to be thin in the upper portion of the semi-transmissive conductive layer 120b formed in a subsequent process. Silver (Ag) particles included in the semi-transmissive conductive layer 120b react with the silicon oxide film 13a and agglomerate through the pin hole, and thus a void is generated in the semi-transmissive conductive layer 120b and causes a dark spot defect.

A method of manufacturing the organic light-emitting display apparatus 2 according to FIG. 6 will now be described with reference to FIGS. 7A through 7I below.

Figure 7A:
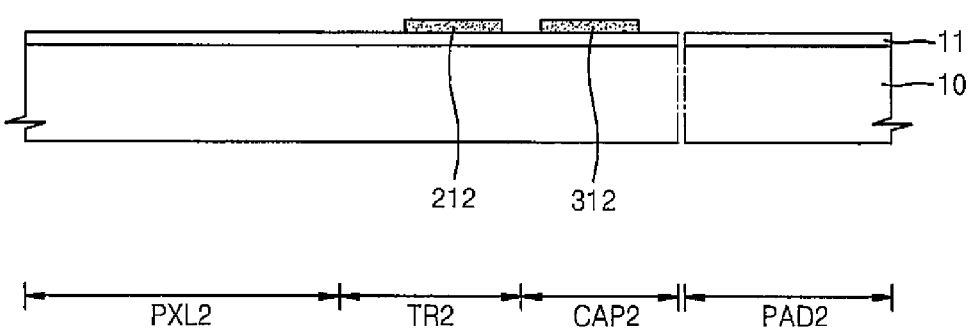
FIGS. 7A through 7I are schematic cross-sectional views illustrating a method of manufacturing the organic light-emitting display apparatus of FIG. 6, according to a comparison example.

FIG. 7A is a schematic cross-sectional view illustrating a first mask process of the organic light-emitting display apparatus 2 according to the comparison example.

The active layer 212 of a thin film transistor and the first electrode 312 of a capacitor are formed on the substrate 10.

Figure 7B:
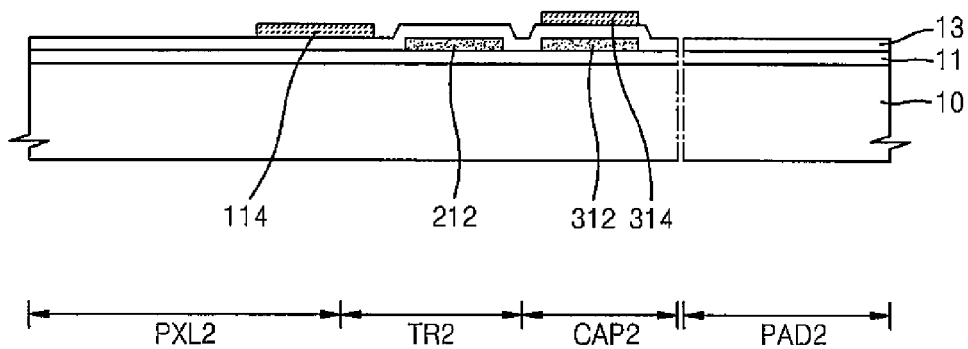

FIG. 7B is a schematic cross-sectional view illustrating a second mask process of the organic light-emitting display apparatus 2 according to the comparison example.

The third contact layer 114 of a cathode electrode contact unit and the second electrode 314 of the capacitor are formed on the first insulating layer 13.

Figure 7C:
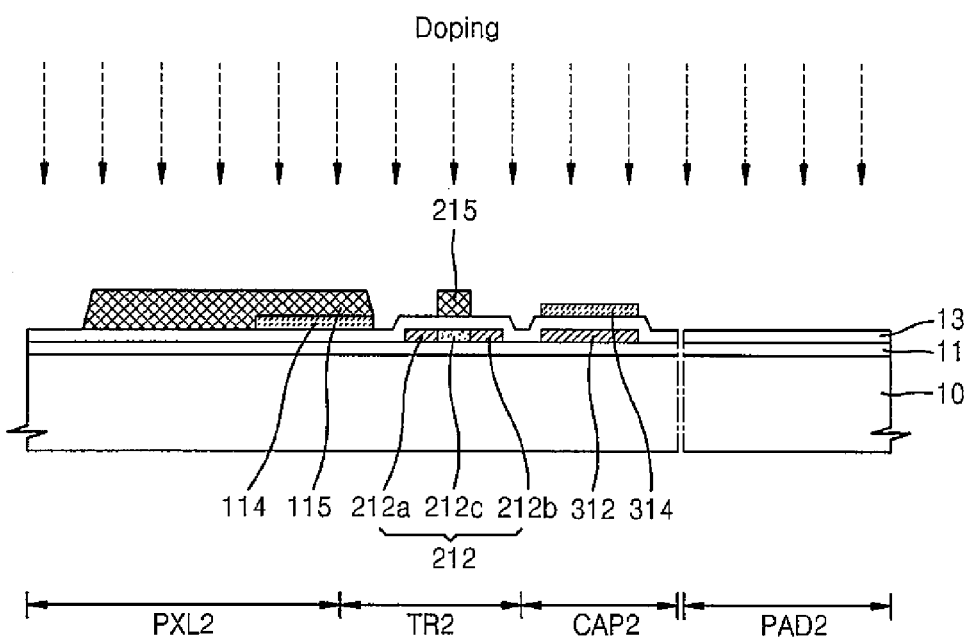

FIG. 7C is a schematic cross-sectional view illustrating a third mask process of the organic light-emitting display apparatus 2 according to the comparison example.

The gate electrode 215 and a gate metal layer 115 covering the third contact layer 114 are formed on the first insulating layer 13.

Figure 7D:
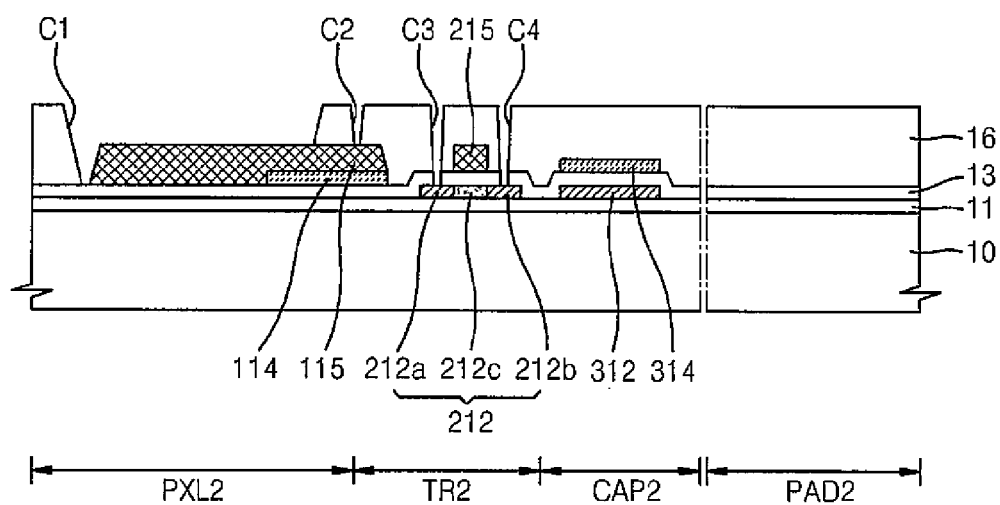

FIG. 7D is a schematic cross-sectional view illustrating a fourth mask process of the organic light-emitting display apparatus 2 according to the comparison example.

Openings C3 and C4 exposing the source area 212a and the drain area 212b of the active layer 212 and the opening C1 are formed at (e.g., in) an area spaced apart from a side of the active layer 212 as an area at (e.g., in) which the pixel electrode 120 is to be located.

Figure 7E:
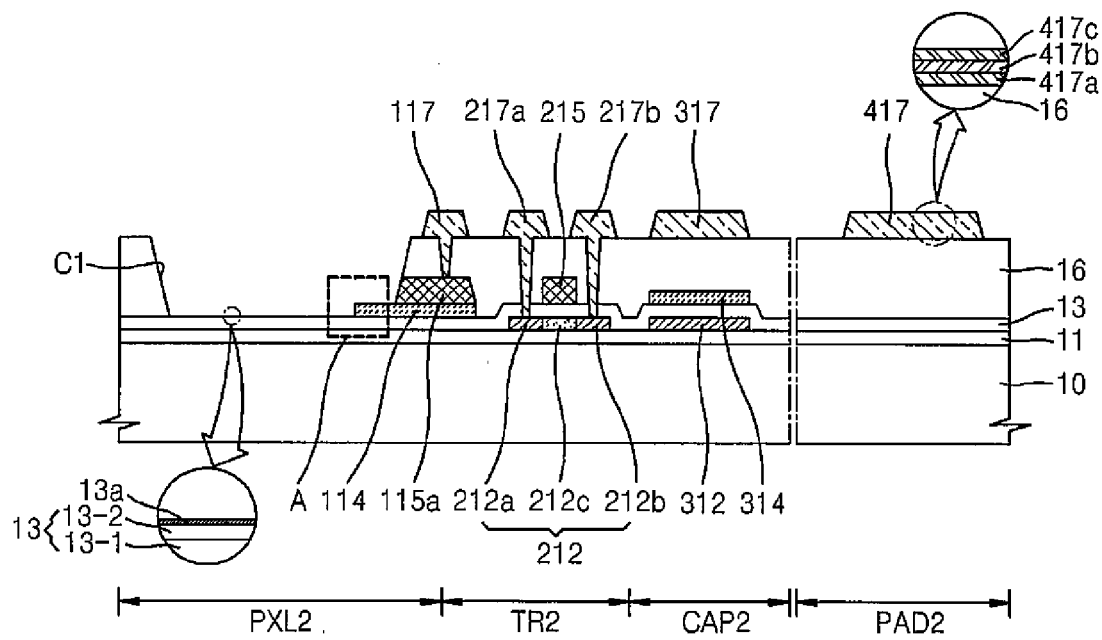

FIG. 7E is a schematic cross-sectional view illustrating a fifth mask process of the organic light-emitting display apparatus 2 according to the comparison example.

Referring to FIG. 7E, a second metal (e.g., electrically conductive) layer is formed on a resultant structure of the fourth mask process of FIG. 7D and then patterned to form the source electrode 217a and the drain electrode 217b, the first contact layer 117 of a pixel electrode contact unit, and the first pad layer 417 of a pad electrode.

During a process of patterning the second metal layer, the gate metal layer 115 formed in the first insulating layer 13 of the opening C1 is etched and removed. During a process of removing the gate insulating layer 13, the first insulating layer 13 may deteriorate. For example, when the first insulating layer 13 used as a gate insulating film has a double structure in which the silicon oxide film 13-1 and the silicon nitride film 13-2 are sequentially stacked from the buffer layer 11 to the pixel electrode 120, the silicon nitride film 13-2 provided on the first insulating layer 13 may be oxidized. In this regard, the silicon oxide film 13a may be formed on a surface of the silicon nitride film 13-2. The silicon oxide film 13a may also be formed on a surface of the first insulating layer 13 by another processing factor during the second through fourth mask processes.

Figure 7F:
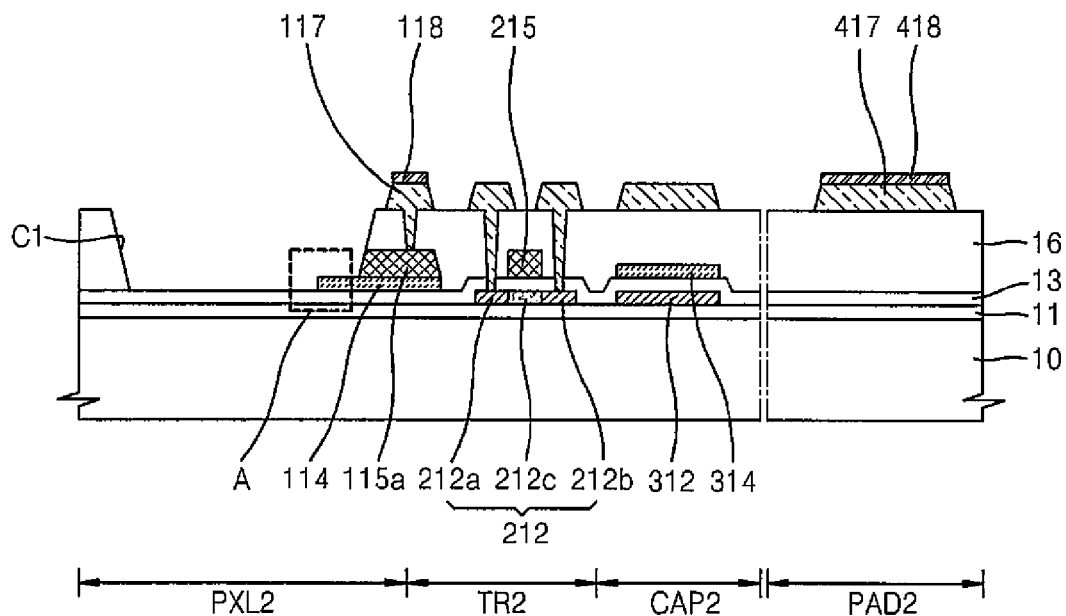

FIG. 7F is a schematic cross-sectional view illustrating a sixth mask process of the organic light-emitting display apparatus 2 according to the comparison example.

Referring to FIG. 7F, a transparent conductive oxide layer is formed on a resultant structure of the fifth mask process of FIG. 7E and then patterned to form the second contact layer 118 of the pixel electrode contact unit and the second pad layer 418 of the pad electrode.

Figure 7G:
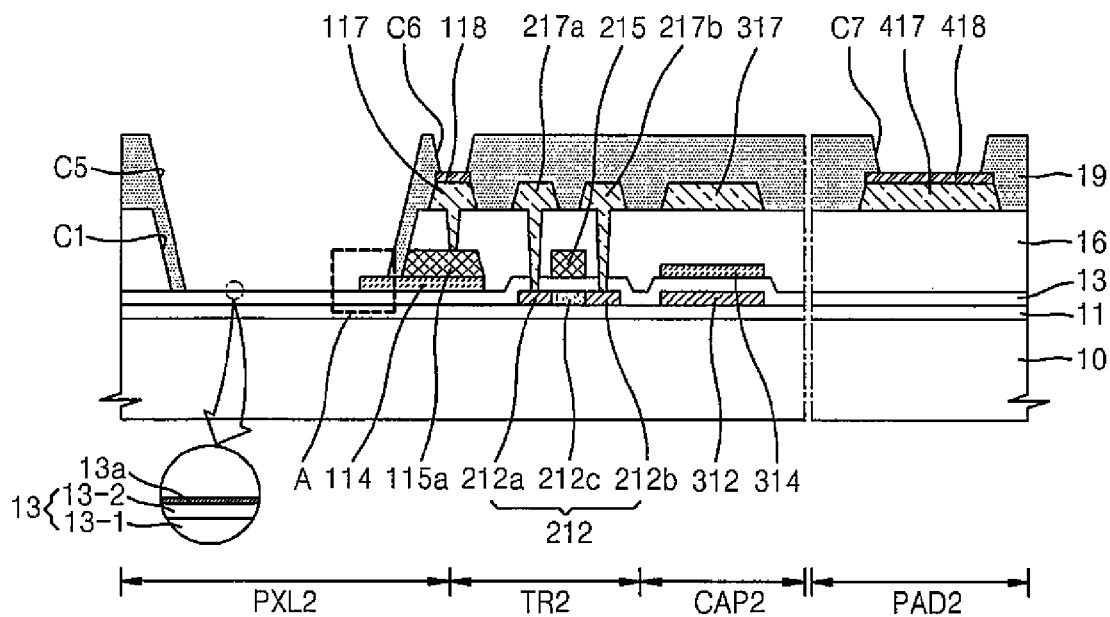

FIG. 7G is a schematic cross-sectional view illustrating a seventh mask process of the organic light-emitting display apparatus 2 according to the comparison example.

Referring to FIG. 7G, the third insulating layer 19 is formed on a resultant structure of the sixth mask process of FIG. 7F and then patterned, and thus the contact hole C6 exposing an upper portion of the second contact layer 118 of the pixel electrode contact unit, the contact hole C7 exposing an upper portion of the second pad layer 418, and the opening C5 are formed at (e.g., in) the pixel area PXL1 at (e.g., in) which the pixel electrode 120 is to be located.

The third insulating layer 19 that remains after being patterned by ashing (or other suitable patterning technique) is removed during a process of patterning the third insulating layer 19 formed as the organic insulating film. In this regard, the silicon oxide film 13a may be formed on a surface of the first insulating layer 13 or may further deteriorate.

Figure 7H:
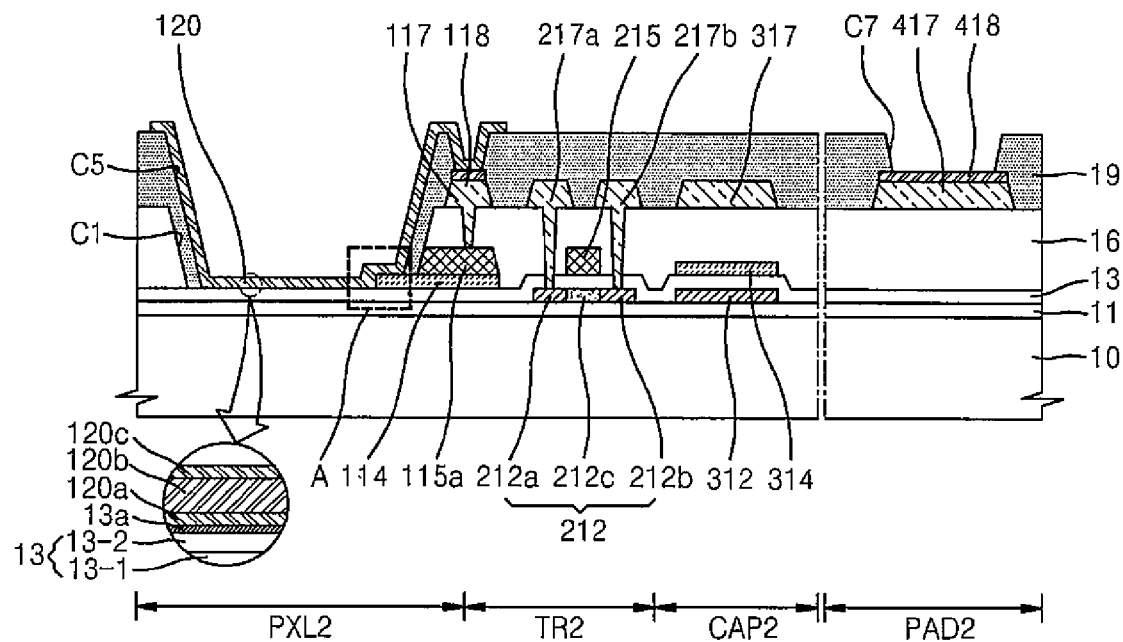

FIG. 7H is a schematic cross-sectional view illustrating an eighth mask process of the organic light-emitting display apparatus 2 according to the comparison example.

Referring to FIG. 7H, a semi-transmissive conductive or metal (e.g., electrically conductive) layer is formed on a resultant structure of the seventh mask process of FIG. 7G and then patterned to form the pixel electrode 120.

The pixel electrode 120 includes the semi-transmissive conductive layer 120b and the first and second transparent conductive oxide layers 120a and 120c that are respectively formed at (e.g., on) lower and upper portions of the semi-transmissive conductive layer 120b and protect the semi-transmissive conductive layer 120b.

The protection layer 119 of the previous embodiment is not formed between the pixel electrode 120 and the first insulating layer 13, and thus silver (Ag) included in the semi-transmissive conductive layer 120b reacts with the silicon oxide film 13a formed on a surface of the silicon nitride film 13-2 and diffuses through a pin hole of the first transparent conductive oxide layer 120a formed to be thin at the lower portion of the semi-transmissive conductive layer 120b. Thus, a void may be generated in the semi-transmissive conductive layer 120b, and the diffused silver (Ag) may cause a dark spot defect.

Figure 7I:
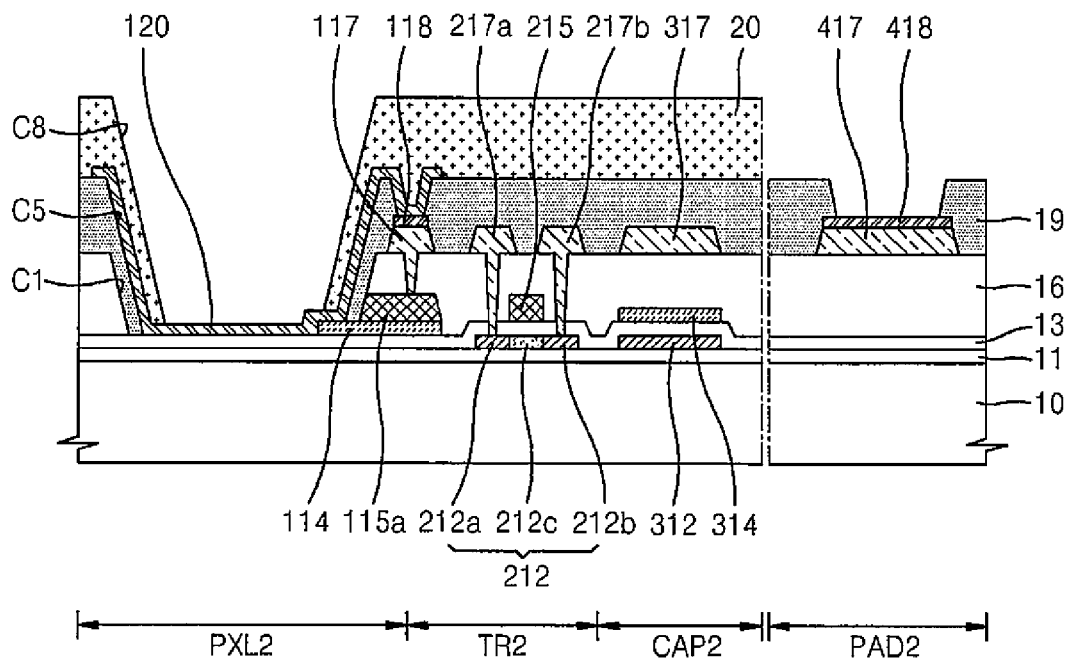

FIG. 7I is a schematic cross-sectional view illustrating a ninth mask process of the organic light-emitting display apparatus 2 according to the comparison example.

Referring to FIG. 7I, the fourth insulating layer 20 is formed on a resultant structure of the eighth mask process of FIG. 7H, and then the ninth mask process of forming the opening C8 exposing an upper portion of the pixel electrode 120 is performed.

An intermediate layer including the organic emission layer 121 of FIG. 6 is formed on a resultant structure of the eighth mask process of FIG. 7H, and the opposing electrode 122 of FIG. 6 is formed.

In this regard, impurities may penetrate into the organic emission layer 121 due to the silver (Ag) void generated in the semi-transmissive conductive layer 120b, which may cause the dark spot defect.

As described above, the organic light-emitting display apparatus 2 according to the comparison example does not include the protection layer 119 between the pixel electrode 120 and the first insulating layer 13, which does not prevent a void from generating due to silver (Ag) of the pixel electrode 120, and thus the dark spot defect occurs. Further, an increase in the light efficiency may not be expected.

Figure 8:
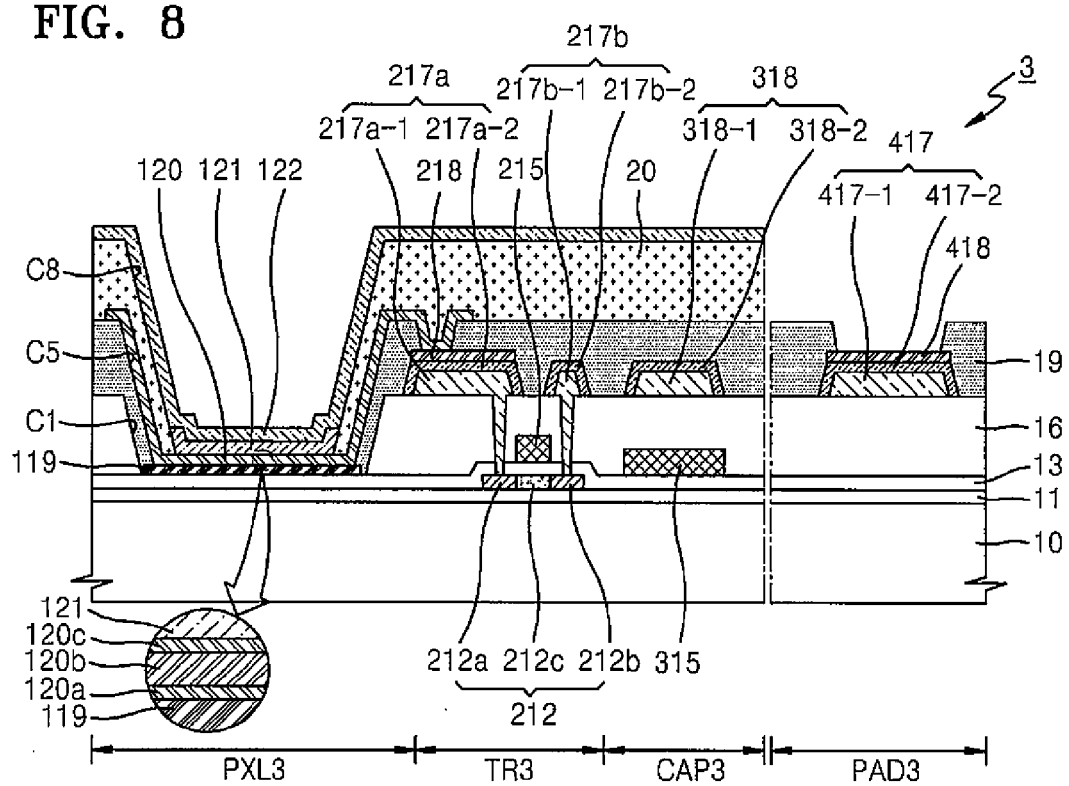
FIG. 8 is a schematic cross-sectional view illustrating a part of a pixel and a pad of an organic light-emitting display apparatus according to another embodiment of the present invention.

FIG. 8 is a schematic plan view illustrating an organic light-emitting display apparatus 3 according to another embodiment of the present invention. FIGS. 9A through 9I are schematic cross-sectional views illustrating a method of manufacturing the organic light-emitting display apparatus of FIG. 8, according to another embodiment of the present invention.

Referring to FIG. 8, a pixel area PXL3 including at least one organic emission layer 121, a transistor area TR3 including at least one thin film transistor, a capacitor area CAP3 including at least one capacitor, and a pad area PAD3 are provided at (e.g., on) the substrate 10.

The following description mainly focuses on differences between the organic light-emitting display apparatus 3 of the present embodiment and the organic light-emitting display apparatus 1 of FIG. 2.

The buffer layer 11 and the active layer 212 are provided on the substrate 10 at (e.g., in) the transistor area TR3. The active layer 212 may include the channel area 212c, and the source area 212a and the drain area 212b which are provided at the outside of the channel area 212c and doped with ion impurities.

The first insulating layer 13 is provided on the active layer 212, and the gate electrode 215 is provided on the first insulating layer 13. The second insulating layer 16 is provided on the gate electrode 215, and the source electrode 217a and the drain electrode 217b are provided on the second insulating layer 16.

In the present embodiment, each of the source electrode 217a and the drain electrode 217b may be formed of two metal layers. For example, the source electrode 217a is formed of a first metal layer 217a-1 and a second metal layer 217a-2 that covers the first metal layer 217a-1. The drain electrode 217b is formed of a first metal layer 217b-1 and a second metal layer 217b-2 that covers the first metal layer 217b-1.

Each of the metal layers 217a-1, 217a-2, 217b-1, and 217b-2 forming the source electrode 217a and the drain electrode 217b may have a structure of two or more heterogeneous metal layers having different electron mobility. For example, each of the metal layers 217a-1, 217a-2, 217b-1, and 217b-2 may have a two or more layer structure including a metal material selected from the group consisting of Al, Pt, Pd, Ag, Mg, Au, Ni, Nd, Ir, Cr, Li, Ca, Mo, Ti, W, Cu, and alloys of these metal materials.

As such, since the source electrode 217a and the drain electrode 217b each are formed of a double metal layer, the thicknesses of the source electrode 217a and the drain electrode 217b may be increased. Accordingly, a signal delay due to wiring resistance may be reduced by lowering the wiring resistance.

The third insulating layer 19 is provided on the source electrode 217a and the drain electrode 217b, and the fourth insulating layer 20 is provided on the third insulating layer 19.

The first insulating layer 13 is provided on the buffer layer 11 at (e.g., in) the pixel area PXL3, and the protection layer 119 and the pixel electrode 120 are provided on the first insulating layer 13. The characteristics of the protection layer 119 and the pixel electrode 120 are the same as or substantially the same as those of the above-described embodiment with respect to FIG. 2.

If the protection layer 119 is not formed between the pixel electrode 120 and the first insulating layer 13, silver (Ag) included in the semi-transmissive conductive layer 120b reacts with the silicon oxide film formed on the surface of the silicon nitride film and diffuses through the pin hole of the first transparent conductive oxide layer 120a formed to be thin at (e.g., on) the lower portion of the semi-transmissive conductive layer 120b. Thus, a void may be generated in the semi-transmissive conductive layer 120b, and the diffused silver (Ag) may cause a dark spot defect. However, according to the present embodiment, since the protection layer 119 is formed between the first insulating layer 13 and the pixel electrode 120, although a material that easily reacts with silver (Ag) is formed on the first insulating layer 13, the protection layer 119 may block the reaction with silver (Ag). Thus, a reactivity of silver (Ag) particles is controlled, thereby remarkably improving the dark spot defect due to silver (Ag) particles. Also, efficiency of light of the organic light-emitting display apparatus 3 may be improved.

The intermediate layer including the organic emission layer 121 is provided on the pixel electrode 120, and the opposing electrode 122 is provided as a common electrode on the organic emission layer 121.

A capacitor having a first electrode 315 arranged at (e.g., in) the same layer as the gate electrode 215 and a second electrode 318 arranged at (e.g., in) the same layer as the source electrode 217a and the drain electrode 217b is provided on the substrate 10 and the buffer layer 11 at (e.g., in) a capacitor area CAP3.

The first electrode 315 of the capacitor may be formed of the same material or substantially the same material as the gate electrode 215. The second electrode 318 of the capacitor may be formed of the same material or substantially the same material as the source electrode 217a and the drain electrode 217b. The second electrode 318 of the capacitor may be formed of two metal layers, that is, a first metal layer 318-1 and a second metal layer 318-2.

The first pad layer 417 and the second pad layer 418 are provided on the second insulating layer 16 at (e.g., in) a pad area PAD3.

The first pad layer 417 may be formed of the same material or substantially the same material as those of the source electrode 217a and the drain electrode 217b. The first pad layer 417 may be formed of two metal layers, that is, a first metal layer 417-1 and a second metal layer 417-2.

The second pad layer 418 may be formed of a transparent conductive oxide. The second pad layer 418 may prevent the first pad layer 417 from being exposed to moisture and oxygen, thereby preventing or reducing deterioration of a reliability of a pad.

A method of manufacturing the organic light-emitting display apparatus 3 according to the present embodiment is briefly described below with reference to FIGS. 9A to 9I.

Figure 9A:
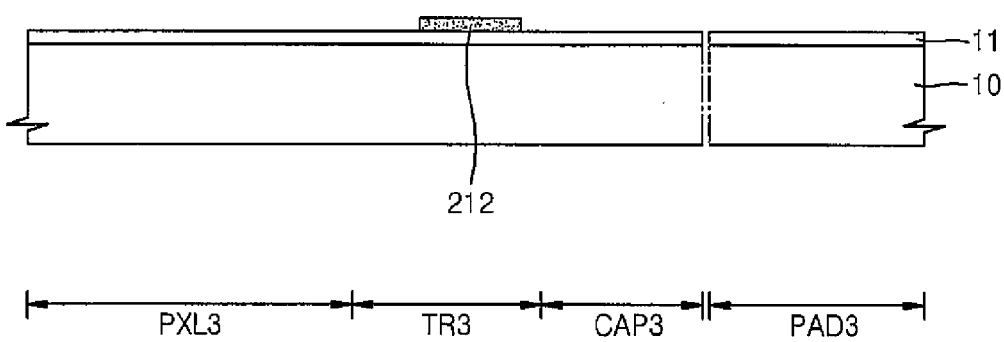
FIGS. 9A through 9I are schematic cross-sectional views illustrating a method of manufacturing the organic light-emitting display apparatus of FIG. 8, according to another embodiment of the present invention.

FIG. 9A is a schematic cross-sectional view illustrating a first mask process of the organic light-emitting display apparatus 3 according to the present embodiment.

Referring to FIG. 9A, the buffer layer 11 is formed on the substrate 10 and the active layer 212 of a thin film transistor is formed on the buffer layer 11.

Figure 9B:
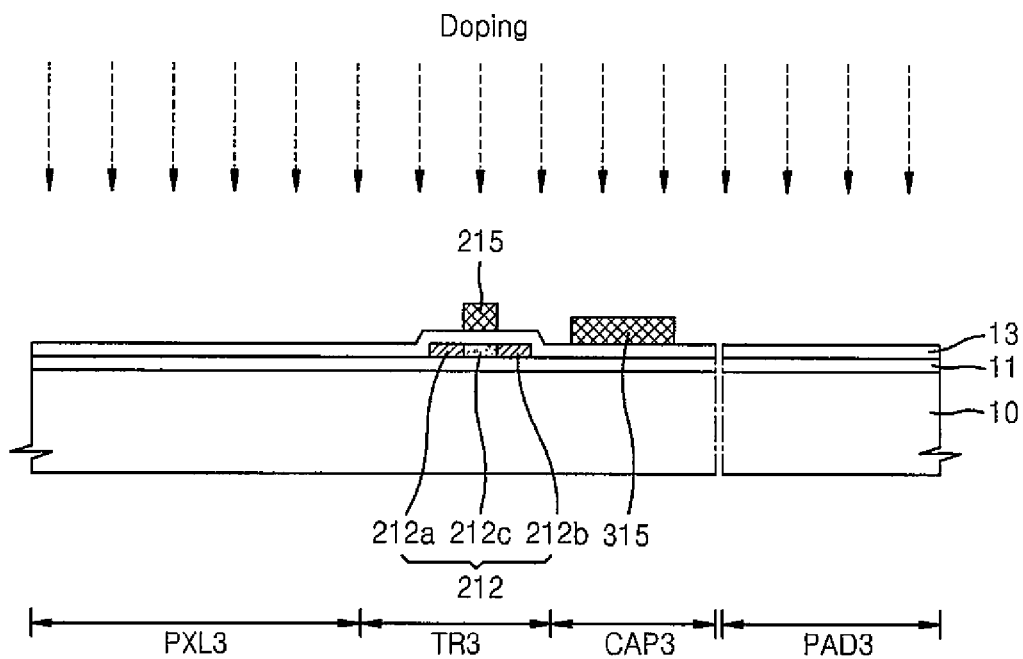

FIG. 9B is a schematic cross-sectional view illustrating a second mask process of the organic light-emitting display apparatus 3 according to the present embodiment.

The first insulating layer 13 is formed on a resultant structure of the first mask process of FIG. 9A. The gate electrode 215 and the first electrode 315 of the capacitor are formed on the first insulating layer 13. Ion impurities are doped in the active layer 212 by using (or utilizing) the gate electrode 215 as a self-align mask. Accordingly, the active layer 212 is provided with the source area 212a and the drain area 212b, which are doped with ion impurities, and the channel area 212c between the source area 212a and the drain area 212b.

Figure 9C:
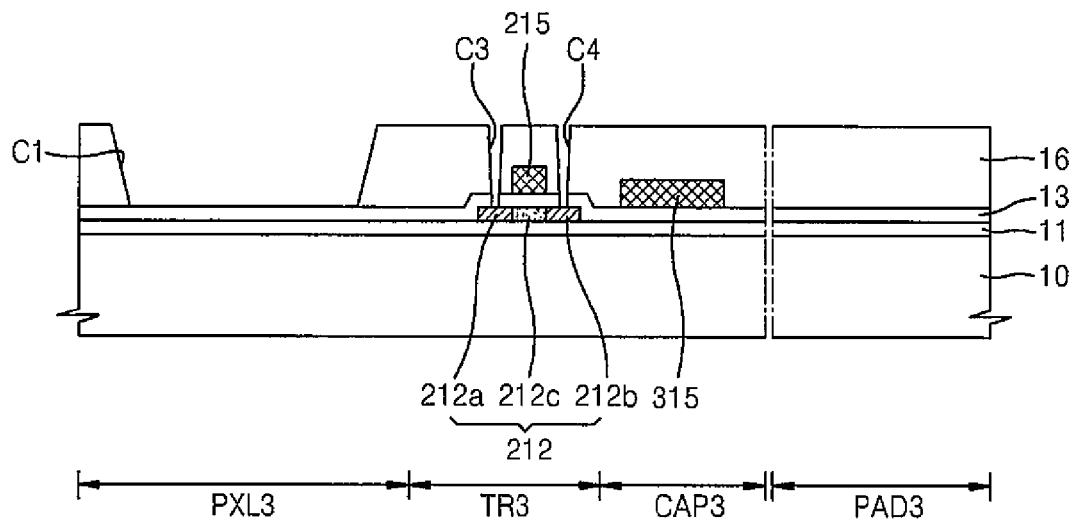

FIG. 9C is a schematic cross-sectional view illustrating a third mask process of the organic light-emitting display apparatus 3 according to the present embodiment.

The second insulating layer 16 is formed on a resultant structure of the second mask process of FIG. 9B. Openings C3 and C4 exposing the source area 212a and the drain area 212b of the active layer 212 and an opening C1 at (e.g., in) an area space apart toward a side surface of the active layer 212 are formed by patterning the second insulating layer 16.

Figure 9D:
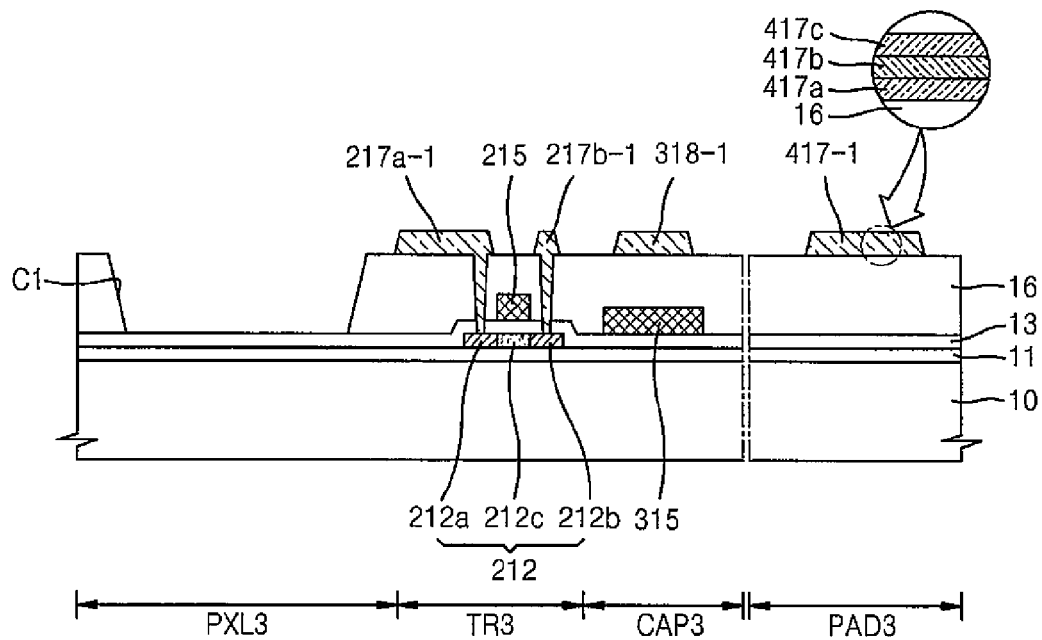

FIG. 9D is a schematic cross-sectional view illustrating a fourth mask process of the organic light-emitting display apparatus 3 according to the present embodiment.

Referring to FIG. 9D, a metal layer is formed on a resultant structure of the third mask process of FIG. 9C. The first metal layer 217a-1 of the source electrode, the first metal layer 217b-1 of the drain electrode, and the first metal layer 417-1 of the first pad layer are simultaneously or concurrently formed by patterning the metal layer. The metal layer may have a structure of two or more heterogeneous metal layers having different electron mobility. For example, the first metal layer 417-1 of the first pad layer may be formed of the first layer 417a including molybdenum (Mo), the second layer 417b including aluminum (Al), and the third layer 417c including molybdenum (Mo).

Figure 9E:
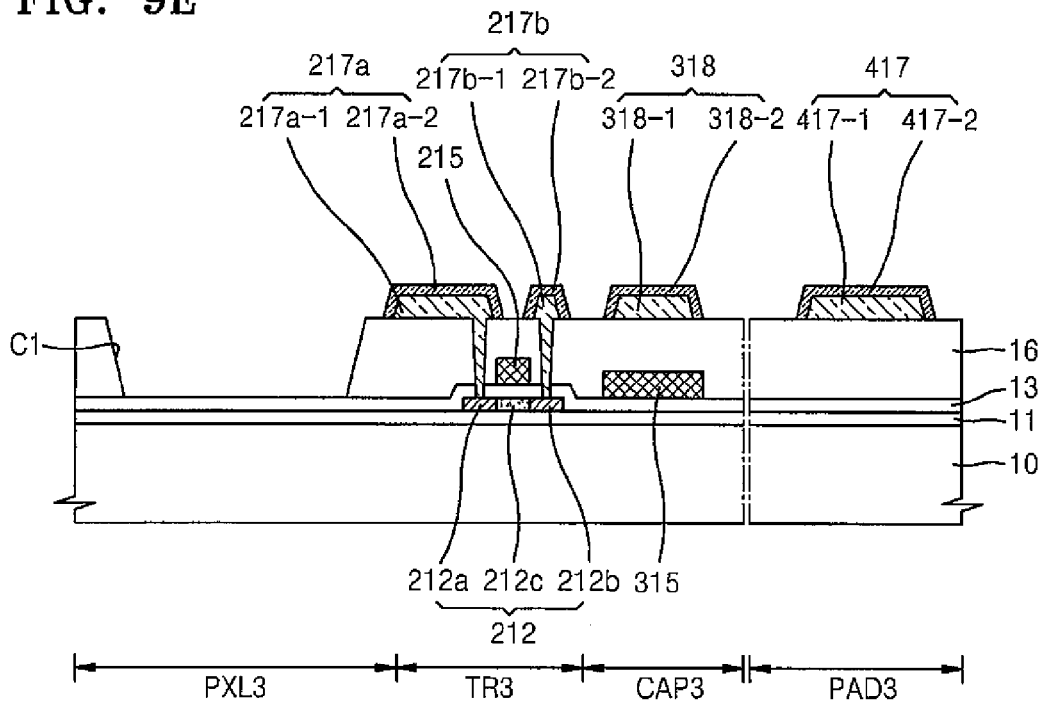

FIG. 9E is a schematic cross-sectional view illustrating a fifth mask process of the organic light-emitting display apparatus 3 according to the present embodiment.

Referring to FIG. 9E, a metal layer is formed on a resultant structure of the fourth mask process of FIG. 9D. The second metal layer 217a-2 of the source electrode, the second metal layer 217b-2 of the drain electrode, and the second metal layer 417-2 of the first pad layer are simultaneously or concurrently formed by patterning the metal layer. The metal layer may have a structure of two or more heterogeneous metal layers having different electron mobility.

Figure 9F:
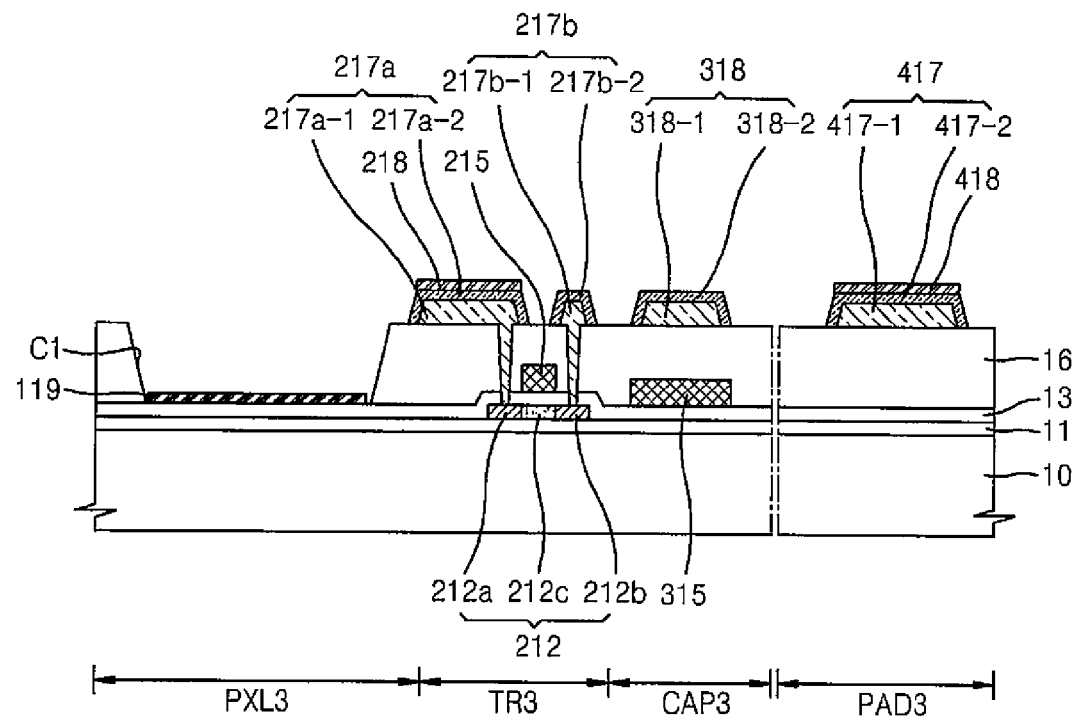

FIG. 9F is a schematic cross-sectional view illustrating a sixth mask process of the organic light-emitting display apparatus 3 according to the present embodiment.

Referring to FIG. 9F, a transparent conductive oxide layer is formed on a resultant structure of the fifth mask process of FIG. 9E. A pixel electrode contact unit 218, the second pad layer 418 of the pad electrode, and the protection layer 119 are simultaneously or concurrently formed by patterning the transparent conductive oxide layer.

Figure 9G:
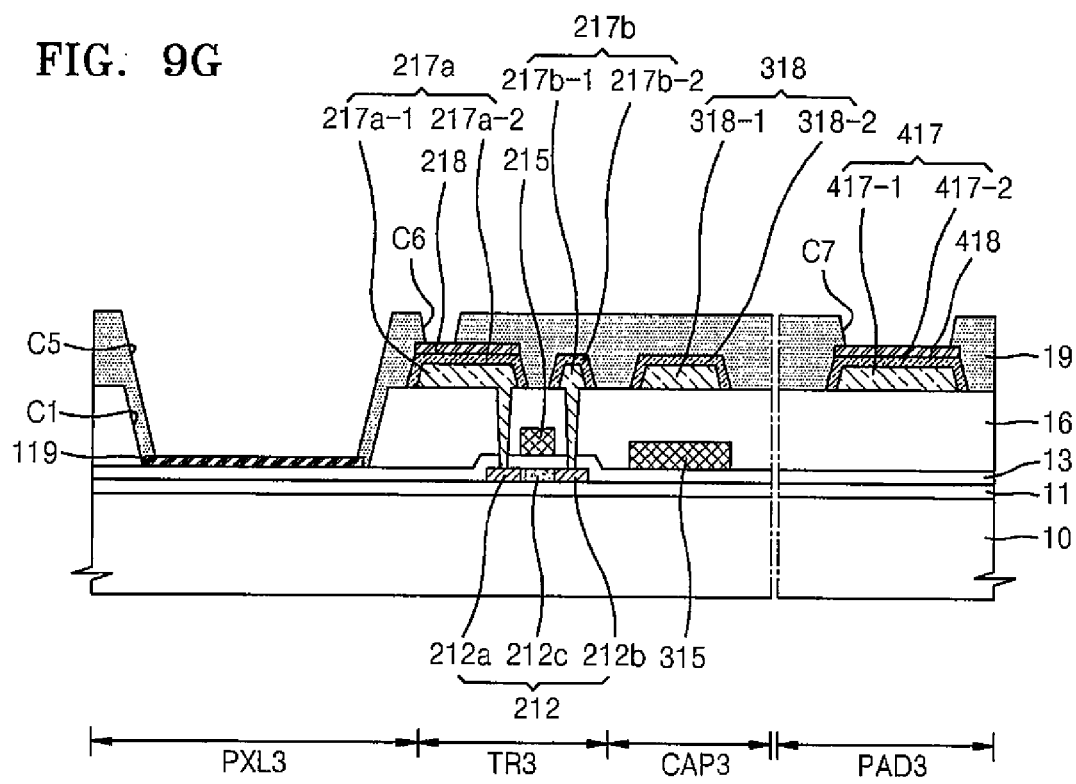

FIG. 9G is a schematic cross-sectional view illustrating a seventh mask process of the organic light-emitting display apparatus 3 according to the present embodiment.

Referring to FIG. 9G, the third insulating layer 19 is formed on a resultant structure of the sixth mask process of FIG. 9F. A contact hole C6 exposing an upper portion of the pixel electrode contact unit 218, a contact hole C7 exposing an upper portion of the second pad layer 418, and an opening C5 at the pixel area PXL3 where the pixel electrode 120 is arranged are formed by patterning the third insulating layer 19.

Figure 9H:
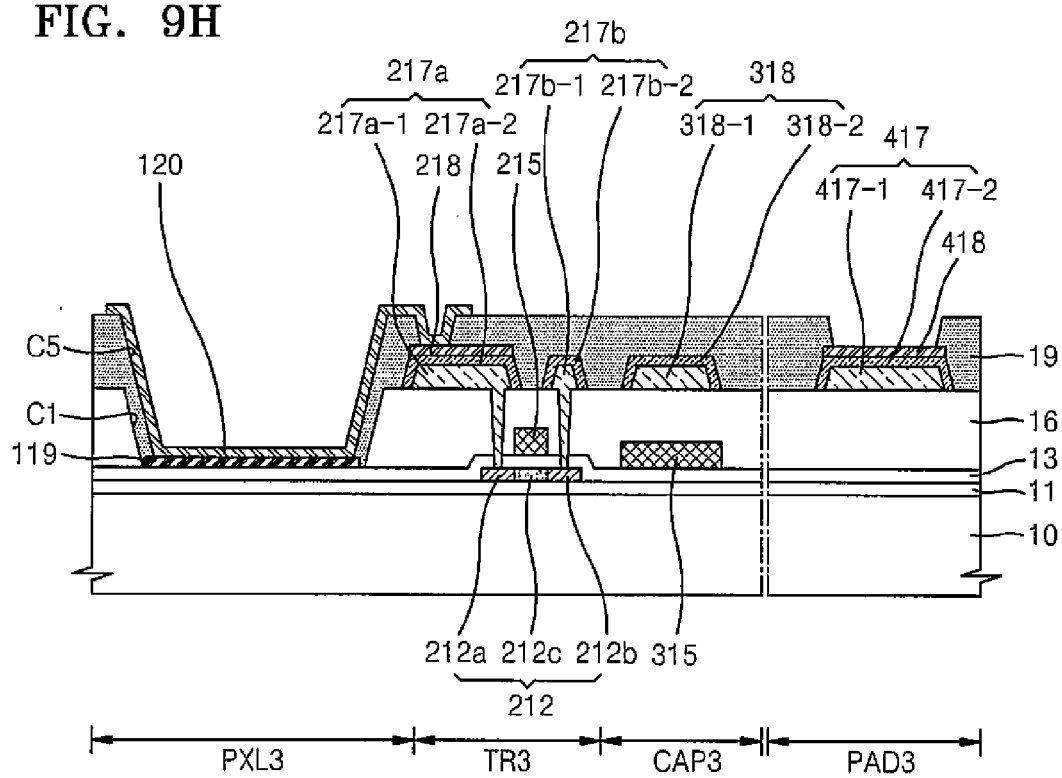

FIG. 9H is a schematic cross-sectional view illustrating an eighth mask process of the organic light-emitting display apparatus 3 according to the present embodiment.

Referring to FIG. 9H, a semi-transmissive conductive or metal layer is formed on a resultant structure of the seventh mask process of FIG. 9G. The pixel electrode 120 is formed by patterning the semi-transmissive conductive layer. The pixel electrode 120 is coupled (e.g., connected) to a drive transistor through the pixel electrode contact unit 218, arranged at the opening C5 that is formed in the third insulating layer 19, and formed on the protection layer 119.

Figure 9I:
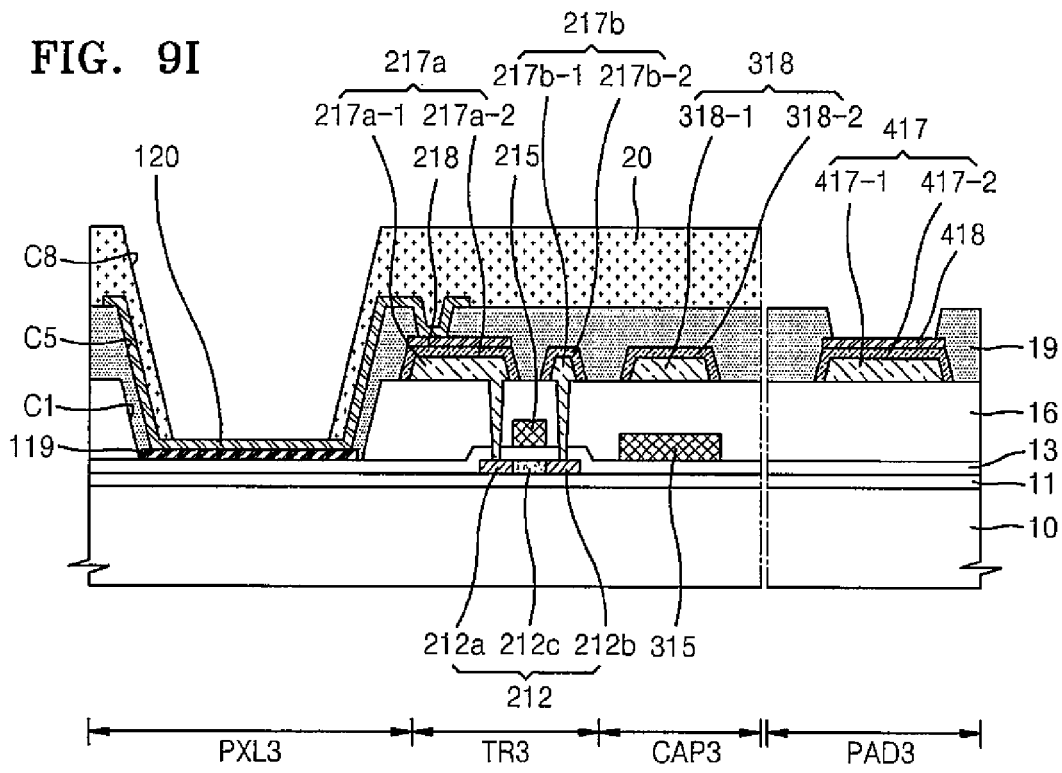

FIG. 9I is a schematic cross-sectional view illustrating a ninth mask process of the organic light-emitting display apparatus 3 according to the present embodiment.

Referring to FIG. 9I, the fourth insulating layer 20 is formed on a resultant structure of the eighth mask process of FIG. 9H, and then the ninth mask process for forming the opening C8 exposing the upper portion of the pixel electrode 120 is performed.

The intermediate layer including the organic emission layer 121 (see FIG. 8) is formed on a resultant structure of the ninth mask process of FIG. 9I, and then, the opposing electrode 122 (see FIG. 8) is formed.

Figure 10:
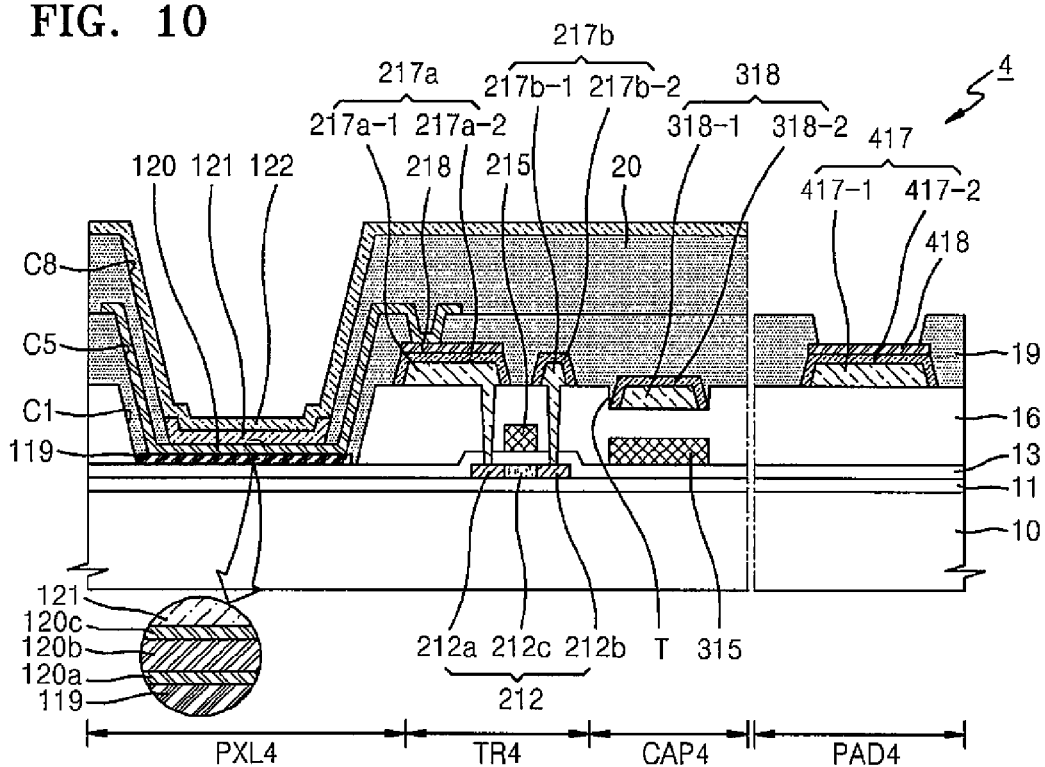
FIG. 10 is a schematic cross-sectional view illustrating a part of a pixel and a pad of an organic light-emitting display apparatus according to another embodiment of the present invention.

FIG. 10 is a schematic cross-sectional view illustrating a part of a pixel and a pad of an organic fight-emitting display apparatus 4 according to another embodiment of the present invention.

Referring to FIG. 10, a pixel area PXL4 including at least one organic emission layer 121, a transistor area TR4 including at least one thin film transistor, a capacitor area CAP4 including at least one capacitor, and a pad area PAD4 are provided at (e.g., on) the substrate 10.

The following description mainly focuses on differences between the organic light-emitting display apparatus 4 of the present embodiment and the organic light-emitting display apparatus 3 of FIG. 8.

The buffer layer 11 and the active layer 212 are provided on the substrate 10 in the transistor area TR4. The active layer 212 may include the channel area 212c, and the source area 212a and the drain area 212b which are provided at the outside of the channel area 212c and doped with ion impurities.

The first insulating layer 13 is provided on the active layer 212, and the gate electrode 215 is provided on the first insulating layer 13. The source electrode 217a and the drain electrode 217b are provided on the second insulating layer 16. As in the above-described embodiment, each of the source electrode 217a and the drain electrode 217b may be formed of two metal layers. For example, the source electrode 217a is formed of the first metal layer 217a-1 and the second metal layer 217a-2 that covers the first metal layer 217a-1. The drain electrode 217b is formed of the first metal layer 217b-1 and the second metal layer 217b-2 that covers the first metal layer 217b-1.

The intermediate layer including the organic emission layer 121 is provided on the pixel electrode 120, and the opposing electrode 122 is provided as a common electrode on the organic emission layer 121.

The first electrode 315 of the capacitor may include the same material or substantially the same material as the gate electrode 215, and the second electrode 318 of the capacitor may include the same material or substantially the same material as the source electrode 217a and the drain electrode 217b.

The second insulating layer 16 that is a dielectric film is located between the first electrode 315 and the second electrode 318 of the capacitor. A trench T is formed in the second insulating layer 16. Since the second electrode 318 of the capacitor is formed at the trench t, the thickness of the dielectric film of the capacitor decreases. Accordingly, capacitance of the capacitor increases.

The first pad layer 417 and the second pad layer 418 are provided on the second insulating layer 16 in a pad area PAD4.

The first pad layer 417 may be formed of the same material or substantially the same material as the source electrode 217a and the drain electrode 217b. The first pad layer 417 may be formed of two metal layers, that is, the first metal layer 417-1 and the second metal layer 417-2.

The second pad layer 418 may be formed of a transparent conductive oxide. The second pad layer 418 may prevent the first pad layer 417 from being exposed to moisture and oxygen, thereby preventing or reducing deterioration of reliability of a pad.

As described above, the organic light-emitting display apparatus and method of manufacturing the same according to the present invention may have the following characteristics:

First, a pixel electrode is formed as a semi-transmissive conductive or metal layer, thereby increasing light efficiency of a display apparatus by a micro cavity.

Second, a source electrode and a drain electrode (including a data wire) are covered by a third insulation layer that is an organic film, thereby preventing silver (Ag) from being educed again due to the source electrode and the drain electrode when the pixel electrode is patterned.

Third, protection layers are formed on a first contact layer of a pixel electrode contact unit, a first contact layer of a cathode contact unit, and a top portion of a first pad layer of a pad electrode, thereby preventing silver (Ag) from being educing again due to the first contact layer and the first pad layer when the pixel electrode is patterned.

Fourth, a structure of the pixel electrode contact unit is dualized, thereby preventing a signal short circuit between the pixel electrode and a driving device.

Fifth, a protection layer including a transparent conductive oxide is formed at (e.g., on) a lower portion of the pixel electrode including the semi-transmissive conductive or metal layer, thereby reducing a dark spot defect due to silver (Ag) and increasing a light characteristic.

While the present invention has been particularly shown and described with reference to example embodiments thereof, it will be understood by those of ordinary skill in the art that various changes in form and details may be made therein without departing from the spirit and scope of the present invention as defined by the following claims, and their equivalents.

What is claimed is:

1. An organic light-emitting display apparatus comprising:
   a thin film transistor comprising an active layer, a gate electrode, a source electrode, a drain electrode, a first insulating layer between the active layer and the gate electrode, and a second insulating layer between the gate electrode and the source and drain electrodes;
   a pad electrode comprising a first pad layer at a same layer as the source electrode and the drain electrode, the first pad layer being at a surface of the second insulating layer facing away from the first insulating layer, and a second pad layer on the first pad layer;
   a third insulating layer covering the source electrode and the drain electrode and an end portion of the pad electrode;
   a pixel electrode comprising a semi-transmissive electrically conductive layer at an opening in the third insulating layer;
   a protection layer between the pixel electrode and the first insulating layer;
   a fourth insulating layer having an opening at a location corresponding to the opening formed in the third insulating layer, the fourth insulating layer covering an end portion of the pixel electrode;
   an emission layer on the pixel electrode; and
   an opposing electrode on the emission layer,
   wherein a portion of the third insulating layer is located between the pixel electrode and the protection layer and covering a portion of a top surface of the protection layer in direct contact.

2. The organic light-emitting display apparatus of claim 1, wherein the protection layer comprises a same material as that of the second pad layer.

3. The organic light-emitting display apparatus of claim 1, wherein the second pad layer comprises a transparent conductive oxide.

4. The organic light-emitting display apparatus of claim 3, wherein the transparent conductive oxide comprises one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

5. The organic light-emitting display apparatus of claim 1, wherein a thickness of the protection layer is in a range of about 200 Å to about 800 Å.

6. The organic light-emitting display apparatus of claim 1, wherein the source electrode and the drain electrode each have a stack structure of a plurality of heterogeneous electrically conductive layers having different electron mobility.

7. The organic light-emitting display apparatus of claim 6, wherein the source electrode and the drain electrode each comprise a layer comprising molybdenum and a layer comprising aluminum.

8. The organic light-emitting display apparatus of claim 1, wherein the source electrode and the drain electrode each comprise a first metal layer and a second metal layer on the first metal layer.

9. The organic light-emitting display apparatus of claim 1, further comprising a capacitor comprising a first electrode at a same layer as the active layer and a second electrode at a same layer as the gate electrode.

10. The organic light-emitting display apparatus of claim 9, wherein the first electrode of the capacitor comprises a semiconductor material doped with ion impurities.

11. The organic light-emitting display apparatus of claim 9, wherein the second electrode of the capacitor comprises a transparent conductive oxide.

12. The organic light-emitting display apparatus of claim 9, wherein the capacitor further comprises a third electrode at a same layer as the source electrode and the drain electrode.

13. The organic light-emitting display apparatus of claim 9, further comprising: a pixel electrode contact unit electrically coupled between the pixel electrode and one of the source electrode and the drain electrode through a contact hole formed in the third insulating layer,
   wherein the pixel electrode contact unit comprises:
   a first contact layer comprising a same material as that of the source electrode and the drain electrode;
   a second contact layer comprising a same material as that of the second pad layer; and
   a third contact layer at the first insulating layer and the second insulating layer and comprising a same material as that of the second electrode of the capacitor,
   wherein the first contact layer is electrically coupled to the third contact layer through a contact hole formed in the second insulating layer.

14. The organic light-emitting display apparatus of claim 13, wherein the pixel electrode contact unit further comprises a fourth contact layer between the first insulating layer and the third insulating layer, the fourth contact layer comprising a same material as that of the gate electrode.

15. The organic light-emitting display apparatus of claim 1, further comprising a capacitor comprising a first electrode at a same layer as the gate electrode and a second electrode at a same layer as the source electrode and the drain electrode.

16. The organic light-emitting display apparatus of claim 15, wherein the first electrode of the capacitor comprises a same material as that of the gate electrode.

17. The organic light-emitting display apparatus of claim 15, wherein the second electrode of the capacitor comprises a same material as that of the source electrode and the drain electrode.

18. The organic light-emitting display apparatus of claim 15, wherein the second insulating layer is between the first electrode and the second electrode and the second electrode is at a trench formed in the second insulating layer.

19. The organic light-emitting display apparatus of claim 1, wherein the first pad layer comprises a same material as that of the source electrode and the drain electrode.

20. The organic light-emitting display apparatus of claim 1, wherein the semi-transmissive electrically conductive layer comprises silver (Ag) or a silver alloy.

21. The organic light-emitting display apparatus of claim 11, wherein a first transparent conductive oxide layer is between the semi-transmissive electrically conductive layer and the protection layer.

22. The organic light-emitting display apparatus of claim 21, wherein a second transparent conductive oxide layer is at an upper portion of the pixel electrode.

23. The organic light-emitting display apparatus of claim 1, wherein an opening in the second insulating layer, an opening in the third insulating layer, and an opening in the fourth insulating layer overlap with each other, and
   wherein a width of the opening in the third insulating layer is greater than a width of the opening in the fourth insulating layer, and smaller than a width of the opening in the second insulating layer.

24. The organic light-emitting display apparatus of claim 23, wherein an end portion of the pixel electrode is at a top end of the opening in the third insulating layer.

* * * * *